United States Patent
Kato

(10) Patent No.: US 8,232,848 B2
(45) Date of Patent: Jul. 31, 2012

(54) SEMICONDUCTOR INTEGRATED CIRCUIT DEVICE

(75) Inventor: Takahiro Kato, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 10 days.

(21) Appl. No.: 13/009,881

(22) Filed: Jan. 20, 2011

(65) Prior Publication Data

US 2011/0193632 A1     Aug. 11, 2011

(30) Foreign Application Priority Data

Feb. 9, 2010  (JP) ................................. 2010-026253

(51) Int. Cl.
*H03K 3/03* (2006.01)
(52) U.S. Cl. .............................. 331/183; 331/45; 331/57
(58) Field of Classification Search ..................... 331/45, 331/57, 183
See application file for complete search history.

(56) References Cited

U.S. PATENT DOCUMENTS 6,963,251 B2 * 11/2005 Liu ................................. 331/57
8,081,038 B2 * 12/2011 Lee et al. ........................ 331/57

FOREIGN PATENT DOCUMENTS

JP          6-188631 A       7/1994

* cited by examiner

*Primary Examiner* — James E Goodley
(74) *Attorney, Agent, or Firm* — Mattingly & Malur, PC

(57) ABSTRACT

Disclosed is a semiconductor integrated circuit device that includes a ring oscillator circuit, performs a proper oscillation operation, and expands the range of oscillation frequency variation. The ring oscillator circuit includes, for instance, plural differential amplifier circuits. MOS transistors are respectively added to input nodes of a differential pair of the differential amplifier circuits. Further, gate control circuits are incorporated to control the gates of the MOS transistors, respectively. The gate control circuits cause the MOS transistors to function as an amplitude limiter circuit in mode 3, exercise control to turn off the amplitude limiter circuit in mode 2, and use the amplitude limiter circuit to start oscillation in mode 1.

17 Claims, 17 Drawing Sheets

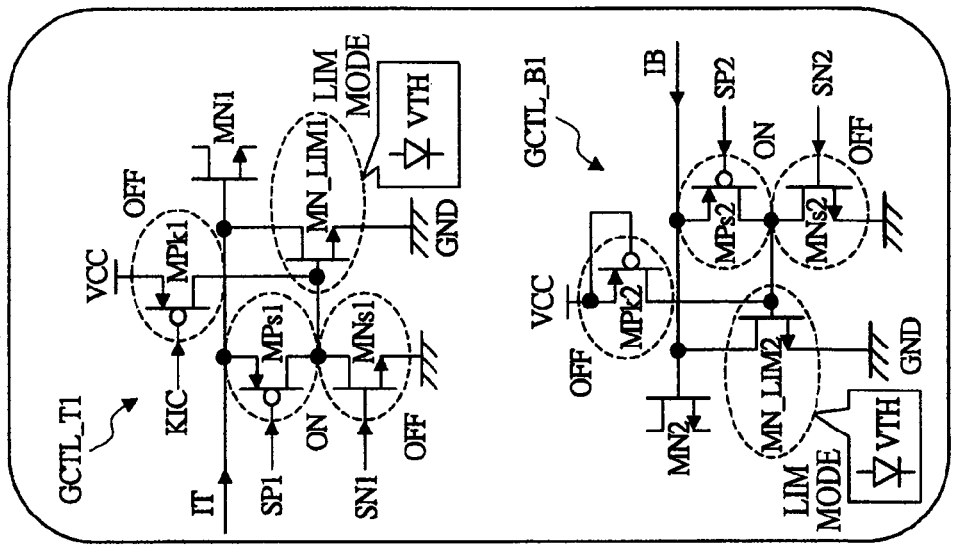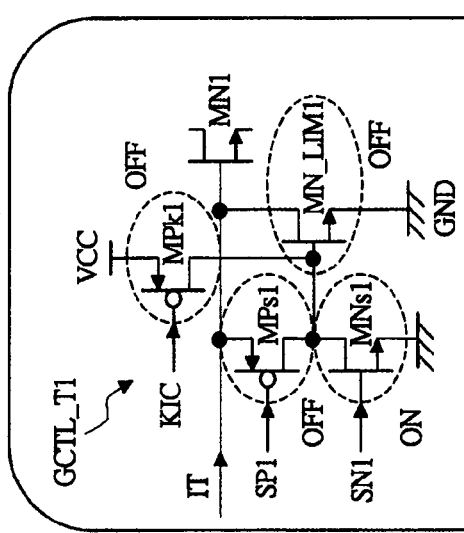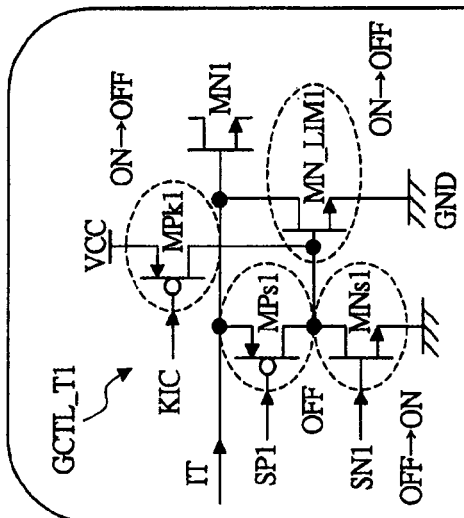
FIG. 5A START OF OSCILLATION (MODE 1)
FIG. 5B LOW-FREQUENCY OSCILLATION (MODE 2)
FIG. 5C HIGH-FREQUENCY OSCILLATION (MODE 3)

SEMICONDUCTOR INTEGRATED CIRCUIT DEVICE

CROSS-REFERENCE TO RELATED APPLICATIONS

The disclosure of Japanese Patent Application No. 2010-26253 filed on Feb. 9, 2010 including the specification, drawings, and abstract is incorporated herein by reference in its entirety.

BACKGROUND OF THE INVENTION

The present invention relates to a semiconductor integrated circuit device, and more particularly to an effective technology, for instance, for a ring oscillator circuit in a PLL (phase-locked loop) circuit.

An oscillator circuit described, for instance, in Japanese Unexamined Patent Publication No. Hei 6 (1994)-188631 includes an inverting amplifier and a feedback circuit, which is coupled between the input and output of the inverting amplifier and includes, for instance, a crystal oscillator. Further, an inverter chain is additionally provided between the input and output of the inverting amplifier to avoid an oscillation start failure.

SUMMARY OF THE INVENTION

In recent years, semiconductor integrated circuit devices have been miniaturized and speeded up. When the semiconductor integrated circuit devices are increasingly miniaturized, supply voltage is lowered from the viewpoint, for instance, of elements' withstanding voltage and electrical power saving. For example, the supply voltage is 1.5 V for the 130-nm generation and 1.2 V for the 65-nm generation. It is expected that the supply voltage will be further lowered from now on. Under these circumstances, it may be demanded that oscillator circuits represented by PLL circuits operate on a low supply voltage and at a high speed in accordance with the aforementioned trend. In addition, it may also be demanded that oscillation frequency be variable over a wider range. For example, DVD recorders and Blu-ray disc recorders use a PLL circuit for read and write operations. However, these recorders are compatible with CDs (Compact Discs) only when the PLL circuit is capable of handling oscillation frequencies within a range, for instance, of several megahertz to several hundred megahertz.

FIGS. 17A and 17B illustrate a semiconductor integrated circuit device that was studied to define the prerequisites for the present invention. FIG. 17A is a block diagram illustrating an exemplary configuration related to a ring oscillator circuit. FIG. 17B is a circuit diagram illustrating an exemplary configuration of each differential amplifier circuit shown in FIG. 17A. FIG. 17A shows the ring oscillator circuit ROSC and a frequency control circuit FCTL. The frequency control circuit FCTL controls the oscillation frequency of the ring oscillator circuit. The ring oscillator circuit ROSC includes, for instance, n cascaded differential amplifier circuits DAMP[1]-DAMP[n]. As regards the differential amplifier circuits DAMP[1] to DAMP[n−1], the positive output node and negative output node (OT[1] and OB[1]) of one differential amplifier circuit (e.g., DAMP[1]) are respectively coupled to the positive input node and negative input node (IT[2] and IB[2]) of the next differential amplifier circuit (e.g., DAMP[2]). Meanwhile, the positive output node OT[n] and negative output node OB[n] of the last differential amplifier circuit DAMP[n] are respectively fed back to the negative input node IB[1] and positive input node IT[1] of the first differential amplifier circuit DAMP[1].

As represented by a differential amplifier circuit DAMP' shown in FIG. 17B, the differential amplifier circuits DAMP[1]-DAMP[n] each include NMOS transistors MN1, MN2, PMOS transistors MP1, MP2, MPk0, and inverter circuits IV1, IV2. The MN1 is configured by coupling its source to a ground supply voltage GND, its gate to a positive input node IT, and its drain to a negative output node OB. The MN2 is configured by coupling its source to the GND, its gate to a negative input node IB, and its drain to a positive output node OT. The MP1 is configured by coupling its source to a supply voltage VCC and its drain to the OB. The MP2 is configured by coupling its source to the VCC and its drain to the OT. The gates of the MP1 and MP2 are commonly coupled. The IV1 uses the OB as an input and the OT as an output. Conversely, the IV2 uses the OT as an input and the OB as an output. The MPk0 is configured by coupling its source to the VCC and its drain to the OB.

When the inverter circuits IV1, IV2 are configured as described above, it is possible to maintain proper phase balance between positive and negative electrodes and obtain an adequate gain in the differential amplifier circuit DAMP' even at a low supply voltage VCC. If, for instance, an additional transistor (e.g., a well-known tail current source) is inserted in a vertical direction (that is, placed between the VCC and GND) in order to increase the gain of the differential amplifier circuit, a low VCC cannot be handled because the range of voltage allocatable to vertically oriented transistors is narrowed. Therefore, the transistors are inserted in a horizontal direction (in the cascading direction) as is the case with the IV1 and IV2. Consequently, two transistors (MP1 and MN1) are vertically aligned as in the case of the DAMP'. This makes it possible to obtain an adequate gain even at a low VCC.

Referring again to FIG. 17B, the frequency control circuit FCTL includes a PMOS transistor MPi1, which forms a current mirror circuit together with the MP1 and MP2 of the differential amplifier circuit DAMP' and is commonly coupled to a gate and a drain, and a variable current supply IS1, which supplies a current between the source and drain of the MPi1. Therefore, the output current of the DAMP' is regulated by controlling the current value of the IS1. The oscillation frequency of the ring oscillator circuit ROSC shown in FIG. 17A is then controlled accordingly.

Here, the ring oscillator circuit ROSC generally starts an oscillation operation by gradually amplifying a week signal such as thermal noise. However, as described earlier, the ring oscillator circuit ROSC may fail to start an oscillation operation because the differential amplifier circuits DAMP[1]-DAMP[n] decrease their gain in accordance with an increase in speed and a decrease in supply voltage VCC. Therefore, like the differential amplifier circuit DAMP' shown in FIG. 17B, a PMOS transistor MPk0 that uses the VCC as a source and the output node OB as a drain (or an NMOS transistor that uses the GND as a source and the OB as a drain) may be added as a start switch. A signal having a relatively large amplitude can then be generated in the OB (which serves as a subsequent input) the moment the MPk0 is switched from the on state to the off state by an oscillation start signal KIC input into the gate of the MPk0. Consequently, the ring oscillator circuit ROSC can use the magnitude of the input signal to compensate for the aforementioned decrease in gain and start the oscillation operation.

However, the use of the above-described PMOS transistor MPk0 (or NMOS transistor) causes the following problems. Firstly, the MPk0 becomes a load during a steady-state operation of the ring oscillator circuit ROSC. This may lower the upper limit of the oscillation frequency of the ROSC, thereby inhibiting an increase in speed. Secondly, as a load is coupled to one polarity of a differential input/output, the balance between positive and negative polarities is impaired even when the IV1 and IV2 are added. This may deteriorate waveform quality, for instance, by degrading the duty cycle and causing an increase in jitter.

The present invention has been made in view of the above circumstances, and provides a semiconductor integrated circuit device capable of performing a proper oscillation operation and a semiconductor integrated circuit device capable of expanding the range of oscillation frequency variation. The foregoing and other features and advantages of the present invention are apparent from the following detailed description taken in conjunction with the accompanying drawings.

A representative embodiment of the present invention disclosed in this document is briefly summarized below.

The semiconductor integrated circuit device according to an embodiment of the present invention includes a ring oscillator circuit, which has plural differential amplifier circuits. The differential amplifier circuits each include a first transistor whose gate is coupled to a positive input node, a second transistor whose gate is coupled to a negative input node, a first limit transistor, a second limit transistor, a first gate control circuit, and a second gate control circuit. The first limit transistor regards a path between the positive input node and low-potential (or high-potential) supply voltage as a source-drain path. The second limit transistor regards a path between the negative input node and low-potential (or high-potential) supply voltage as a source-drain path. The first and second gate control circuits have a first operation mode. In the first operation mode, the first gate control circuit causes the first limit transistor to function as a first diode, which limits the signal amplitude of the positive input node to its threshold voltage, or as a first variable resistor, which has a predetermined resistance value. Similarly, the second gate control circuit causes the second limit transistor to function as a second diode, which limits the signal amplitude of the negative input node to its threshold voltage, or as a second variable resistor, which has a predetermined resistance value.

When the signal amplitudes of the positive and negative input nodes are limited as described above by the first and second diodes or the first and second variable resistors, the upper limit of the oscillation frequency of the ring oscillator circuit can be improved.

In the above-described semiconductor integrated circuit device, the first and second gate control circuits further have a second operation mode. In the second operation mode, the first gate control circuit causes the first limit transistor to function as a first control switch and causes the first control switch to alternate between a conduction state and a nonconduction state, whereas the second gate control circuit causes the second limit transistor to function as a second control switch and causes the second control switch to remain in either the conduction state or the nonconduction state. Thus, the first and second limit transistors having the aforementioned amplitude limiting function can be used to start oscillation of the ring oscillator circuit.

In the above-described semiconductor integrated circuit device, the first and second gate control circuits further have a third operation mode. In the third operation mode, the first gate control circuit maintains the aforementioned first control switch in the nonconduction state, whereas the second gate control circuit maintains the aforementioned second control switch in the nonconduction state. As described earlier, the use of the first operation mode makes it possible to improve the upper limit of the oscillation frequency of the ring oscillator circuit. The use of the third operation mode additionally makes it possible to improve the lower limit of the oscillation frequency.

In short, the representative embodiment of the present invention disclosed in this document enables the ring oscillator circuit to properly start its oscillation and expand the range of oscillation frequency variation.

BRIEF DESCRIPTION OF THE DRAWINGS

Embodiments of the present invention will be described in detail based on the following figures, wherein:

FIGS. 1A and 1B are diagrams illustrating a semiconductor integrated circuit device according to a first embodiment of the present invention, in which FIG. 1A is a schematic diagram illustrating an exemplary configuration of essential parts of the semiconductor integrated circuit device, and FIG. 1B is a diagram illustrating an exemplary operating concept based on FIG. 1A;

FIGS. 5A to 5C are diagrams illustrating different exemplary operations of gate control circuits in the differential amplifier circuit shown in FIG. 4;

FIGS. 17A and 17B are diagrams illustrating a semiconductor integrated circuit device studied to define the prerequisites for the present invention, in which FIG. 17A is a block diagram illustrating an exemplary configuration of a portion related to the ring oscillator circuit, and FIG. 17B is a circuit diagram illustrating an exemplary configuration of the differential amplifier circuits shown in FIG. 17A.

DETAILED DESCRIPTION OF THE INVENTION

Figure 1B:
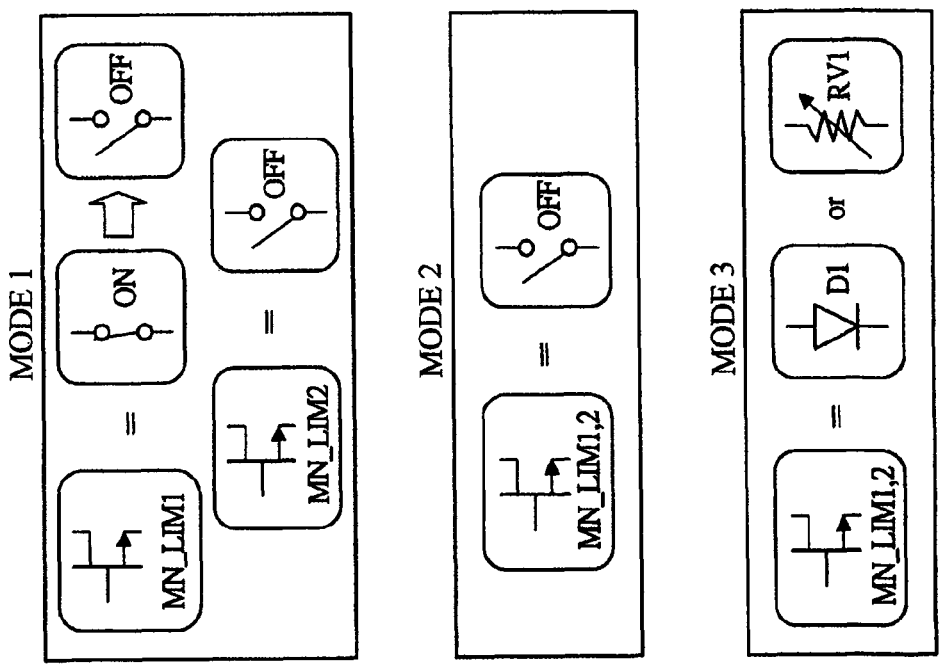

In the following description of the embodiments, if necessary for convenience sake, a description of the present invention will be given in a divided manner in plural sections or embodiments, but unless otherwise stated, they are not unrelated to each other, but are in a relation such that one is a modification, represents details, or is a supplementary explanation, of a part or the whole of the other. Also, in the embodiments described below, when referring to the number of elements (including the number of pieces, numerical values, amounts, ranges, and the like), the number of elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, the positional relationship therebetween, and the like are mentioned, the substantially approximate and similar shapes and the like are included therein unless otherwise stated or except the case where it is conceivable that they are apparently excluded in principle. The same goes for the aforementioned numerical values and ranges.

Furthermore, circuit elements configuring respective functional blocks of the embodiments are formed over a semiconductor substrate such as single crystal silicon by an integrated circuit technology, for instance, of a publicly-known CMOS (complementary metal-oxide semiconductor transistor) although there is no particular limitation. It should be noted that, in the embodiments, a MOSFET (metal oxide semiconductor field effect transistor) is used as an example of a MISFET (metal insulator semiconductor field effect transistor). However, it does not mean that a non-oxidized film is unacceptable as a gate insulating film. In the drawings, a circle mark is attached to the gate of a p-channel MOS transistor (PMOS transistor) so as to distinguish it from an n-channel MOS transistor (NMOS transistor). While a coupling method for the substrate potential of the MOS transistor is not particularly indicated in the drawings, it is not specifically limited as far as it permits the MOS transistor to operate normally.

Embodiments of the present invention will now be described in detail with reference to the accompanying drawings. In all the drawings illustrating the embodiments, like members are designated by the same reference numerals and will not be redundantly described.

First Embodiment

Overview of Essential Parts of a Differential Amplifier Circuit

Figure 1A:
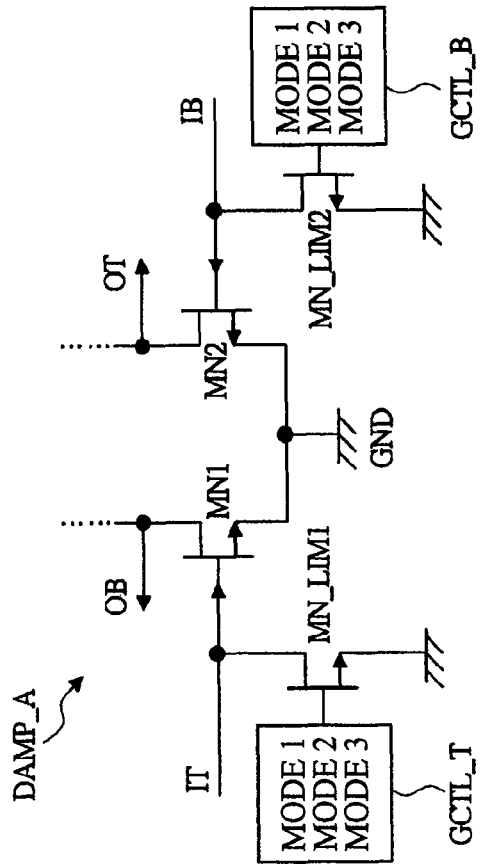
Figure 2A:
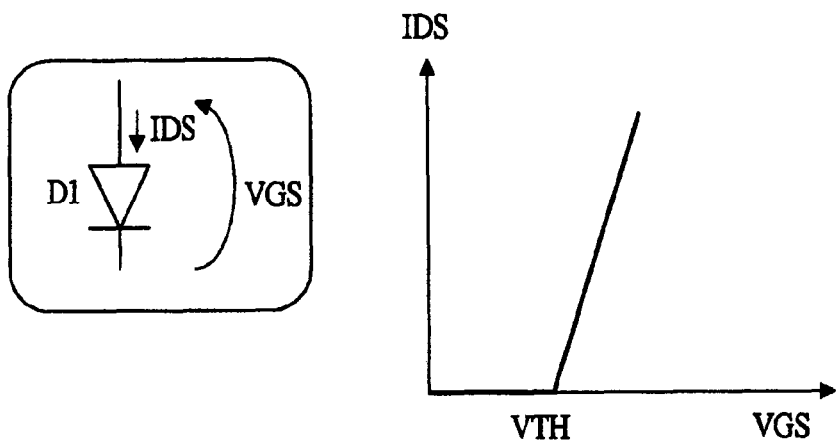
FIGS. 2A and 2B are supplementary diagrams for FIG. 1B.
Figure 2B:
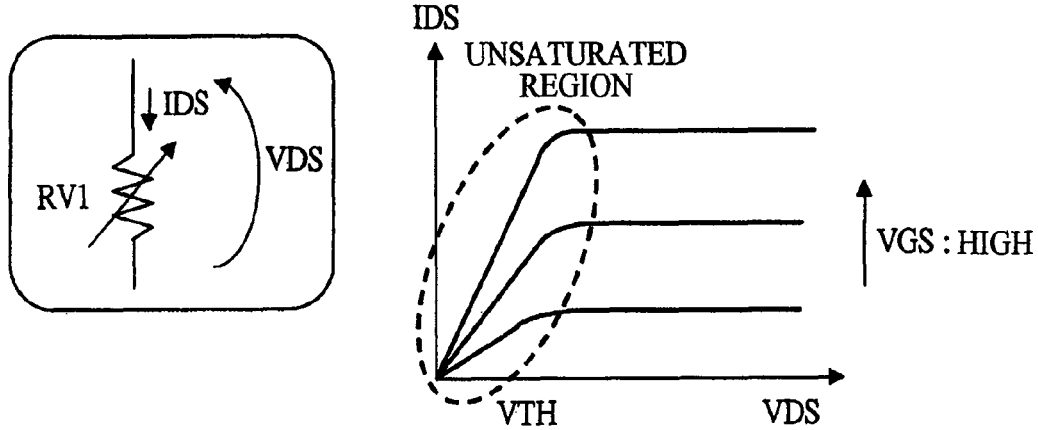

FIGS. 1A and 1B are diagrams illustrating a semiconductor integrated circuit device according to a first embodiment of the present invention. FIG. 1A is a schematic diagram illustrating an exemplary configuration of essential parts of the semiconductor integrated circuit device. FIG. 1B is a diagram illustrating an exemplary operating concept based on FIG. 1A. FIGS. 2A and 2B are supplementary diagrams for FIG. 1B. FIG. 1A shows an exemplary configuration of the essential parts of the semiconductor integrated circuit device (differential amplifier circuit) DAMP_A, which is a component of a ring oscillator circuit ROSC described with reference, for instance, to FIG. 17A. The differential amplifier circuit DAMP_A shown in FIG. 1A includes NMOS transistors MN1, MN2 that form a differential pair, NMOS transistors MN_LIM1, MN_LIM2 that have a limiter function, and gate control circuits GCTL_T, GCTL_B.

The MN1 is configured by coupling its source to a ground supply voltage GND, its gate to a positive input node IT, and its drain to a negative output node OB. The MN2 is configured by coupling its source to the GND, its gate to a negative input node IB, and its drain to a positive output node OT. The MN_LIM1 is configured by coupling its source to the GND and its drain to the IT, and by allowing its gate to be controlled by GCTL_T. Similarly, the MN_LIM2 is configured by coupling its source to the GND and its drain to the IB, and by allowing its gate to be controlled by GCTL_B.

The GCTL_T and GCTL_B selecting one of three different operation modes (modes 1 to 3) to control the MN_LIM1 and MN_LIM2. As shown in FIG. 1B, in mode 1, the GCTL_T and GCTL_B cause the MN_LIM1 and MN_LIM2 to function as a switch. More specifically, the GCTL_B causes the MN_LIM2 to remain in the off state, whereas the GCTL_T causes the MN_LIM1 to switch from the on state to the off state. In this instance, a potential difference represented by a stepped waveform arises between the IT and IB when the GCTL_T causes the MN_LIM1 to switch from the on state to the off state. This causes the ring oscillator circuit to start oscillating. In mode 2, the GCTL_T and GCTL_B cause both the MN_LIM1 and MN_LIM2 to function as a switch and remain in the off state.

In mode 3, the GCTL_T and GCTL_B cause the MN-LIM1 and MN_LIM2 to function as a diode D1 by using the IT/IB side as an anode or function as a variable resistor RV1. When, for instance, the MN-LIM1 and MN_LIM2 are to function as the diode D1, control should be exercised so that both the MN-LIM1 and MN_LIM2 are diode-coupled (that is, coupled with the gate and drain short-circuited). When, on the other hand, the MN-LIM1 and MN_LIM2 are to function as the variable resistor RV1, control should be exercised to determine gate bias points of the MN_LIM1 and MN_LIM2 in such a manner that the MN_LIM1 and MN_LIM2 mainly operate in an unsaturated region. FIG. 2A illustrate exemplary voltage-current characteristics obtained when the MN-LIM1 and MN_LIM2 function as the diode D1. FIG. 2B illustrate exemplary voltage-current characteristics obtained when the MN-LIM1 and MN_LIM2 function as the variable resistor RV1.

When the MN-LIM1 and MN_LIM2 function as the diode D1 or the variable resistor RV1 as described above, the amplitudes of signals entering the IT and IB can be controlled (limited). When, for instance, the MN-LIM1 and MN_LIM2 function as the diode D1, the signal amplitudes of the IT and IB can be limited within a range from the GND level to the D1's threshold voltage (VTH). When, on the other hand, the MN-LIM1 and MN_LIM2 function as the variable resistor RV1, the upper limit for a high-potential end of the signal amplitudes of the IT and IB can be lowered by decreasing the resistance value of the variable resistor RV1.

Figure 3A:
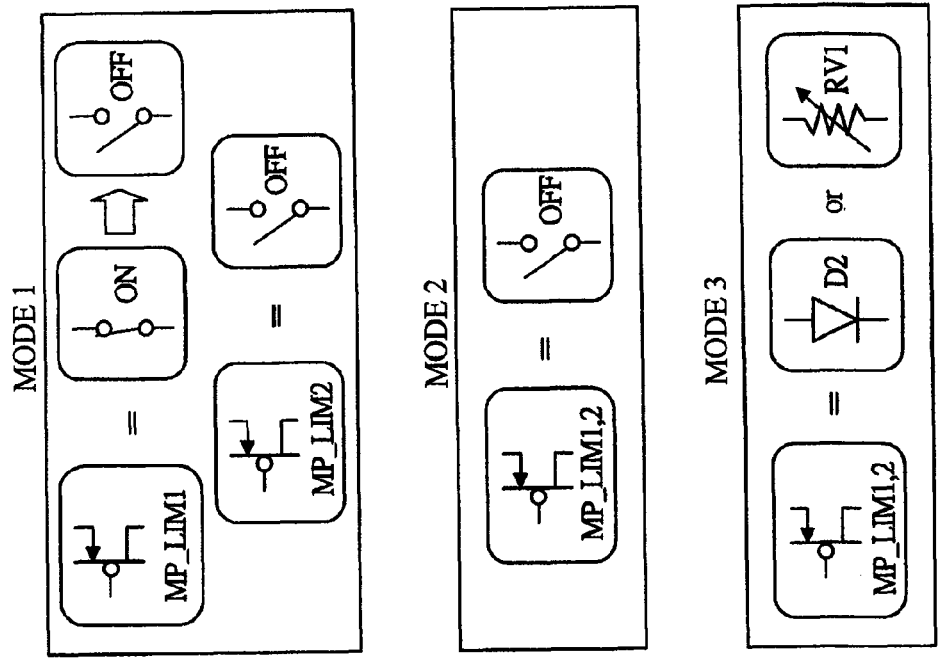
FIG. 3A is a schematic diagram illustrating an exemplary modification based on FIG. 1A.
Figure 3B:
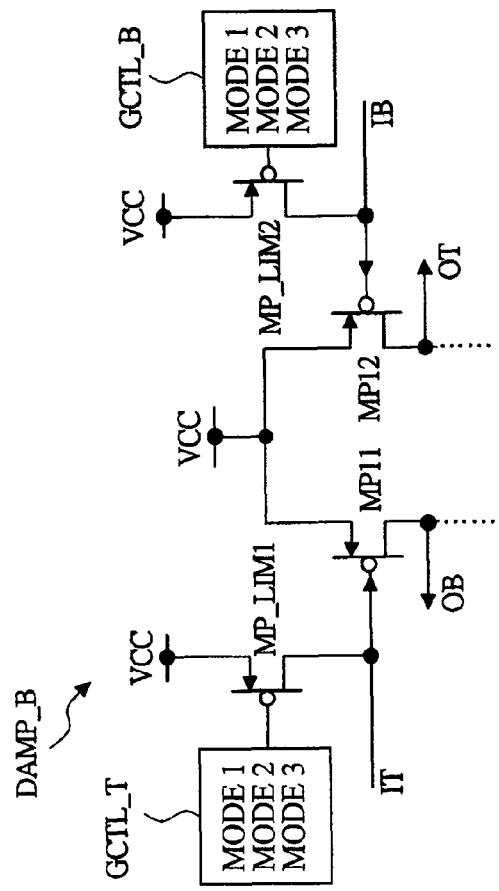
FIG. 3B is a diagram illustrating an exemplary operating concept based on FIG. 3A.

FIG. 3A is a schematic diagram illustrating an exemplary modification based on FIG. 1A. FIG. 3B is a diagram illustrating an exemplary operating concept based on FIG. 3A. The semiconductor integrated circuit device (differential amplifier circuit) DAMP_B shown in FIG. 3A is a differential amplifier circuit DAMP_A that is shown in FIG. 1A and formed by PMOS transistors. More specifically, the DAMP-B includes PMOS transistors MP11, MP12 that allow their sources to be coupled to a supply voltage VCC and form a differential pair, PMOS transistors MP_LIM1, MP_LIM2 that are coupled between the gates of the MP11 and MP12 and the VCC and provided with a limiter function, and gate control circuits GCTL_T, GCTL_B.

As shown in FIG. 3B, the operations performed in modes 1 and 2 by the GCTL_T and GCTL_B are the same as indicated in FIG. 1B. However, the operations performed in mode 3 are contrary to those performed as indicated in FIG. 1B. More specifically, when the MP_LIM1 and MP_LIM2 function as the diode D2, the IT/IB side functions as the cathode of the D2 so that the signal amplitudes of the IT and IB are limited within a range from the (VCC-VTH) level to the VCC. When, on the other hand, the MP_LIM1 and MP_LIM2 function as the variable resistor RV1, the lower limit for a low-potential end of the signal amplitudes of the IT and IB is raised by decreasing the resistance value of the variable resistor RV1.

<Effects of the Essential Parts of the Differential Amplifier Circuit>

Figure 17A:
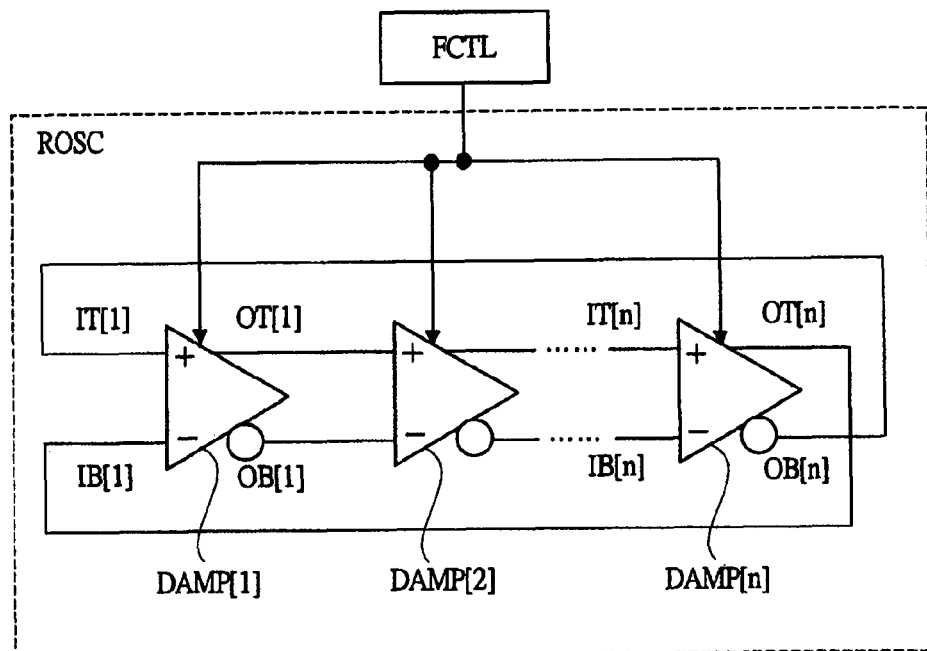

When the differential amplifier circuits DAMP_A, DAMP_B shown in FIGS. 1A, 1B, 3A, and 3B are applied to the ring oscillator circuit ROSC shown, for instance, in FIG. 17A, the following effects will be produced. Firstly, as the limiter function is incorporated, the upper limit for the oscillation frequency of the ring oscillator circuit ROSC can be raised. More specifically, when the MN_LIM1 and MN_LIM2 or MP_LIM1 and MP_LIM2 are employed to limit the signal amplitudes in mode 3, a small-amplitude operation is performed to raise the upper limit for the oscillation frequency.

However, if the MN_LIM1 and MN_LIM2 or MP_LIM1 and MP_LIM2 are added to the input or output node as described with reference to FIG. 17B, it is anticipated that the oscillation frequency might decrease due to resultant capacitive load. However, the MN_LIM1 and MN_LIM2 or MP_LIM1 and MP_LIM2 can be implemented in an extremely smaller transistor size than the other transistors (e.g., MN1 and MN2). Thus, the advantage of imposing amplitude limitation is greater than the disadvantage of capacitive load. From the viewpoint of transistor size reduction (that is, from the viewpoint of reducing the disadvantage of capacitive load), therefore, the exemplary configuration shown in FIG. 1A in which NMOS transistors are used is more preferable than the exemplary configuration shown in FIG. 3A in which PMOS transistors are used. The transistor size can be reduced by performing ion injection in such a manner as to lower the threshold voltages of the MN_LIM1 and MN_LIM2 or MP_LIM1 and MP_LIM2.

In an alternative configuration conceivable as a comparative example, a so-called varactor capacitance, which controls the oscillation frequency by making use of variable capacitance between the source and drain of a MOS transistor and the gate thereof instead of the aforementioned limiter function, can be added to the input or output node of the differential amplifier circuit. However, the varactor capacitance is not suitable for miniaturization in marked contrast to the exemplary configuration shown in FIGS. 1A, 1B, 3A, and 3B. Even if control is exercised to minimize the capacitance value, a more or less high capacitance value remains to inhibit an increase in speed. Consequently, it is preferred that the upper limit for the oscillation frequency be raised by exercising the limiter function shown in FIGS. 1A, 1B, 3A, and 3B.

Secondly, the aforementioned limiter function can be exercised to start oscillation. In other words, oscillation can be started without inhibiting an increase in speed as described earlier by causing the MN_LIM1 and MN_LIM2 or MP_LIM1 and MP_LIM2 to operate in mode 1. Referring again to FIG. 17B, which shows a configuration as a comparative example, a PMOS transistor MPk0, which is used only to start oscillation, is added to the input or output node of a differential amplifier circuit. This PMOS transistor MPk0 merely brings about the disadvantage of capacitive load and inhibits an increase in speed. Further, in the exemplary configurations shown in FIGS. 1A, 1B, 3A, and 3B, transistors (MN_LIM1 and MN_LIM2 or MP_LIM1 and MP_LIM2) are added to both the positive input node IT and negative input node IB. This provides a better balance between positive and negative electrodes, higher waveform quality, and a higher speed than the exemplary configuration shown in FIG. 17B.

Thirdly, the lower limit for the oscillation frequency can be lowered by making it possible to exercise control so as to disable the limiter function. More specifically, the range of oscillation frequency variation can be expanded in addition to the effect described firstly when the MN_LIM1 and MN_LIM2 or MP_LIM1 and MP_LIM2 operate in mode 2. When the oscillation frequency is low (when, for instance, a small current is supplied from the frequency control circuit FCTL shown in FIG. 17B), signal amplitude usually decreases with a decrease in gain so that oscillation stops when the signal amplitude decreases below a certain level. It means that the lower limit for the oscillation frequency may lower with an increase in signal amplitude while the oscillation frequency is low. When the limiter function is enabled as described earlier, the signal amplitude is limited. Therefore, even when the signal amplitude is within the range of the threshold value of the diode D1, the signal amplitude is slightly limited. Consequently, the signal amplitude increases when the limiter function is disabled.

<Details of the Differential Amplifier Circuit>

Figure 4:
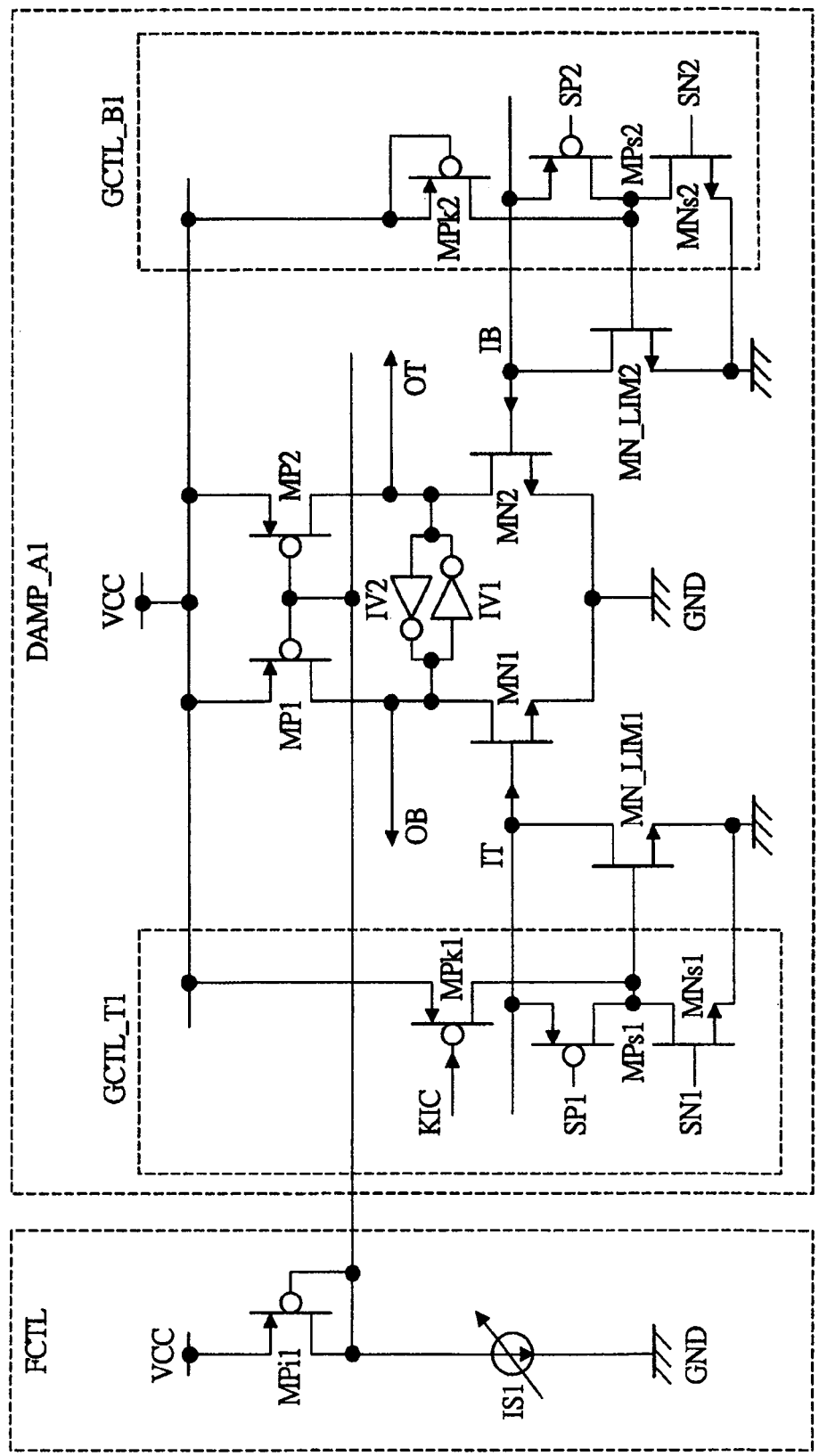
FIG. 4 is a circuit diagram illustrating a detailed exemplary configuration of a differential amplifier circuit shown in FIGS. 1A and 1B.

FIG. 4 is a circuit diagram illustrating a detailed exemplary configuration concerning the differential amplifier circuit DAMP_A shown in FIGS. 1A and 1B. FIG. 4 shows exemplary circuit configurations of a differential amplifier circuit DAMP_A1 and a frequency control circuit FCTL that controls the oscillation frequency of the differential amplifier circuit DAMP_A1. The differential amplifier circuit DAMP_A1 includes NMOS transistors MN_LIM1, MN_LIM2 having a limiter function and gate control circuits GCTL_T1, GCTL_B1 in addition to the NMOS transistors MN1, MN2, the PMOS transistors MP1, MP2, and the inverter circuits IV1, IV2.

The MN1 is configured by coupling its source to a ground supply voltage GND, its gate to a positive input node IT, and its drain to a negative output node OB. The MN2 is configured by coupling its source to the GND, its gate to a negative input node IB, and its drain to a positive output node OT. The MP1 is configured by coupling its source to a supply voltage VCC and its drain to the OB. The MP2 is configured by coupling its source to the VCC and its drain to the OT. The gates of the MP1 and MP2 are commonly coupled. The IV1 uses the OB as an input and the OT as an output. Conversely, the IV2 uses the OT as an input and the OB as an output. When the inverter circuits IV1, IV2 are employed as described above, it is possible to maintain proper phase balance between positive and negative electrodes and obtain an adequate gain in the differential amplifier circuit DAMP_A1 even at a low supply voltage VCC, as described with reference to FIG. 17B.

Further, as described with reference to FIG. 1A, the MN_LIM1 is configured by coupling its source to the GND and its drain to the IT while its gate is controlled by the GCTL_T1. Similarly, the MN_LIM2 is configured by coupling its source to the GND and its drain to the IB while its gate is controlled by the GCTL_B1. The GCTL_T1 includes PMOS transistors MPk1, MPs1 and an NMOS transistor MNs1. The MPk1 is configured by coupling its source to the VCC and its drain to the gate of the MN_LIM1 while the gate of the MPk1 is controlled by the oscillation start signal KIC. The MPs1 is configured by coupling one of its source and drain to the IT and the other to the gate of the MN_LIM1 while the gate of the MPs1 is controlled by a switch control signal SP1. The MNs1 is configured by coupling its source to the GND and its drain to the gate of the MN_LIM1 while the gate of the MNs1 is controlled by a switch control signal SN1.

As is the case with the GCTL_T1, the GCTL_B1 includes PMOS transistors MPk2, MPs2 and an NMOS transistor MNs2. Unlike the case with the GCTL_T1, the MPk2 is configured by coupling its source and gate to the VCC and its drain to the gate of the MN_LIM2. The MPs2 is configured by coupling one of its source and drain to the IB and the other to the gate of the MN_LIM2 while the gate of the MPs2 is controlled by a switch control signal SP2. The MNs2 is configured by coupling its source to the GND and its drain to the gate of the MN_LIM2 while the gate of the MNs2 is controlled by a switch control signal SN2. The MPk2 constantly remains in the off state and is used as a dummy to maintain symmetry with the MPk1.

Figure 17B:
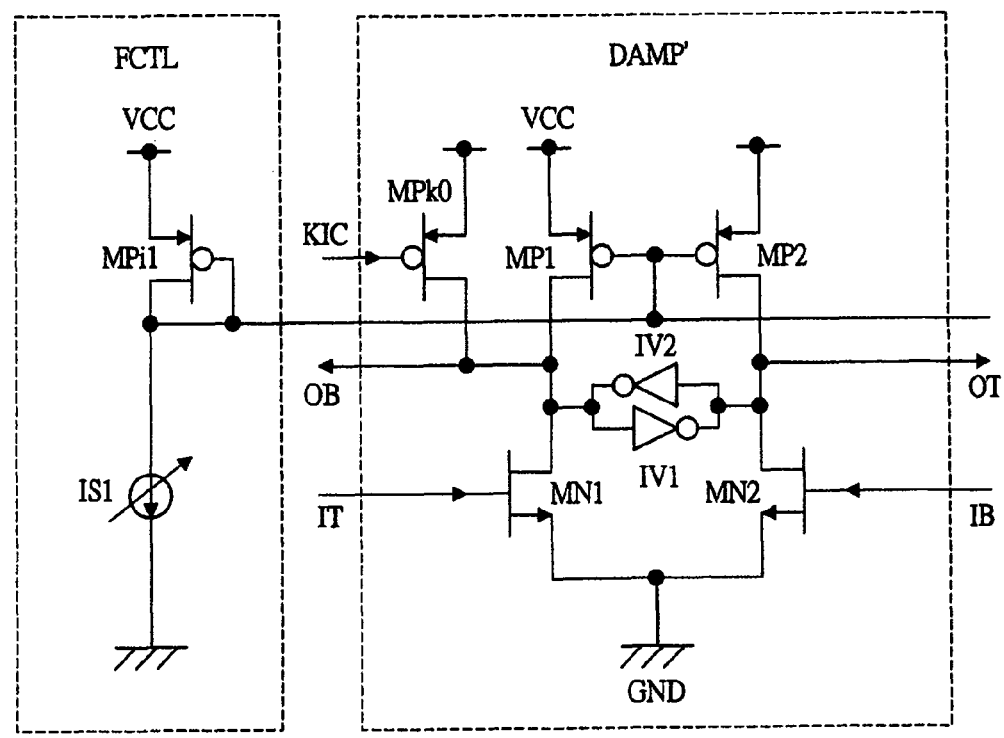

Referring again to FIG. 4, the frequency control circuit FCTL includes, as is the case shown in FIG. 17B, a PMOS transistor MPi1, which forms a current mirror circuit together with the MP1 and MP2 of the differential amplifier circuit DAMP_A1 and is commonly coupled to a gate and a drain, and a variable current supply IS1, which supplies a current between the source and drain of the MPi1. Therefore, the propagation delay time of the DAMP_A1 decreases with an increase in the electrical current value of the IS1. Consequently, the oscillation frequency becomes higher when the DAMP_A1 is applied to a ring oscillator circuit.

Figure 6:
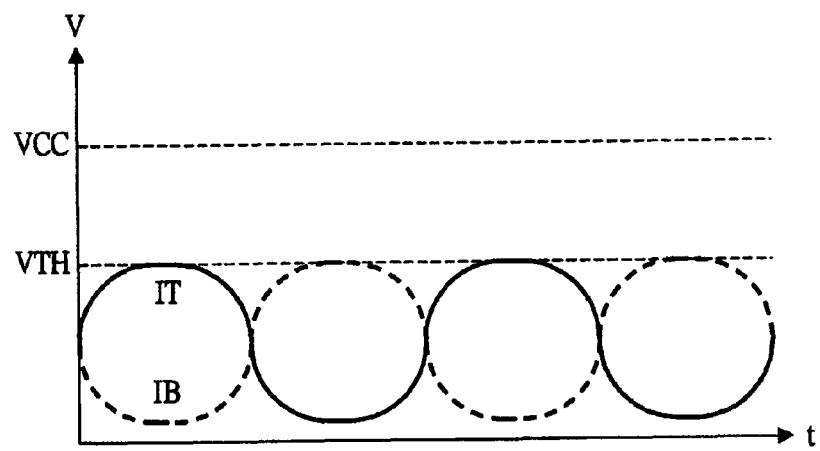
FIG. 6 is a supplementary diagram for FIG. 5C.

FIGS. 5A to 5C are diagrams illustrating different exemplary operations of the gate control circuits GCTL in the differential amplifier circuit DAMP_A1 shown in FIG. 4. FIG. 6 is a supplementary diagram for FIG. 5C. FIG. 5A shows an example of an operation performed in mode 1, which was described with reference to FIGS. 1A and 1B. Mode 1 is used to start oscillation as described earlier. In this instance, the GCTL_B1 exercises control so as to place the SP2 at "H" level and the SN2 at "L" level. This places both the MPs2 and MNs2 in the off state. Therefore, the MN_LIM2 usually remains in the off state as no particular control is provided for the MN_LIM2. Meanwhile, the GCTL_T1 exercises control so as to place the SP1 at "H" level, as is the case with the GCTL_B1. This places the MPs1 in the off state. However, unlike the GCTL_B1, the GCTL_T1 exercises control so as to switch the KIC and SN1 from the "L" state to the "H" state, switch the MPk1 from the on state to the off state, and switch the MNs1 from the off state to the on state, thereby switching the MN_LIM1 from the on state to the off state. Consequently, oscillation starts as described with reference to FIGS. 1A and 1B.

FIG. 5B shows an example of an operation performed in mode 2, which was described with reference to FIGS. 1A and 1B. Mode 2 is used for low-frequency oscillation as described earlier. In this instance, the GCTL_B1 exercises control so as to place the SP2 at "H" level and the SN2 at "H" level. This places the MPs2 in the off state and the MNs2 in the on state. Therefore, the MN_LIM2 remains in the off state. Meanwhile, the GCTL_T1 exercises control so as to place the SP1 at "H" level and the SN1 at "H" level, as is the case with the GCTL_B1. This places the MPs1 in the off state and the MNs1 in the on state. Further, the GCTL_T1 exercises control so as to place the KIC at "H" level, place the MPk1 in the off state, and place the MN_LIM1 in the off state. This disables the limiter function. Consequently, the lower-limit frequency for low-frequency oscillation can be decreased as described with reference to FIGS. 1A and 1B.

FIG. 5C shows an example of an operation performed in mode 3, which was described with reference to FIGS. 1A and 1B. Mode 3 is used for high-frequency oscillation as described earlier. In this instance, the GCTL_B1 exercises control so as to place the SP2 at "L" level and the SN2 at "L" level. This places the MPs2 in the on state and the MNs2 in the off state. Therefore, diode coupling is established in the MN_LIM2. Meanwhile, the GCTL_T1 exercises control so as to place the SP1 at "L" level and the SN1 at "L" level, as is the case with the GCTL_B1. This places the MPs1 in the on state and the MNs1 in the off state. Further, the GCTL_T1 exercises control so as to place the KIC at "H" level and place the MPk1 in the off state, thereby establishing diode coupling in the MN_LIM1 as well. This enables the limiter function. Consequently, the upper-limit frequency for high-frequency oscillation can be increased as described with reference to FIGS. 1A and 1B. While the limiter function is enabled, the signal amplitudes of the IT and IB are limited within a range from the GND level (0 V) to the MN_LIM1's threshold value VTH, as shown in FIG. 6. Although the VCC and VTH are not specifically limited, it may be assumed, for instance, that the VCC is 1.0 V while the VTH is 0.5 V.

In the gate control circuits GCTL_T1, GCTL_B1 described above, the MPs1 and MPs2 are added as capacitive loads for the IT and IB, as is the case with the MN_LIM1 and MN_LIM2. However, as mentioned earlier, the MN_LIM1 and MN_LIM2 can be implemented in a small transistor size. Further, the MPs1 and MPs2, which drive the gates of the MN_LIM1 and MN_LIM2, can also be implemented in a small transistor size. Therefore, the disadvantage of capacitive load is insignificant. In addition, this disadvantage can be reduced by replacing the PMOS transistors MPs1, MPs2 with NMOS transistors. Furthermore, the overhead of a circuit area does not cause any particular problem because the other transistors (MPk1, MPk2, MNs1, and MNs2), which drive the gates of the MN_LIM1 and MN_LIM2, can also be implemented in a small transistor size.

<Overview of an Optical Disk System>

Figure 7:
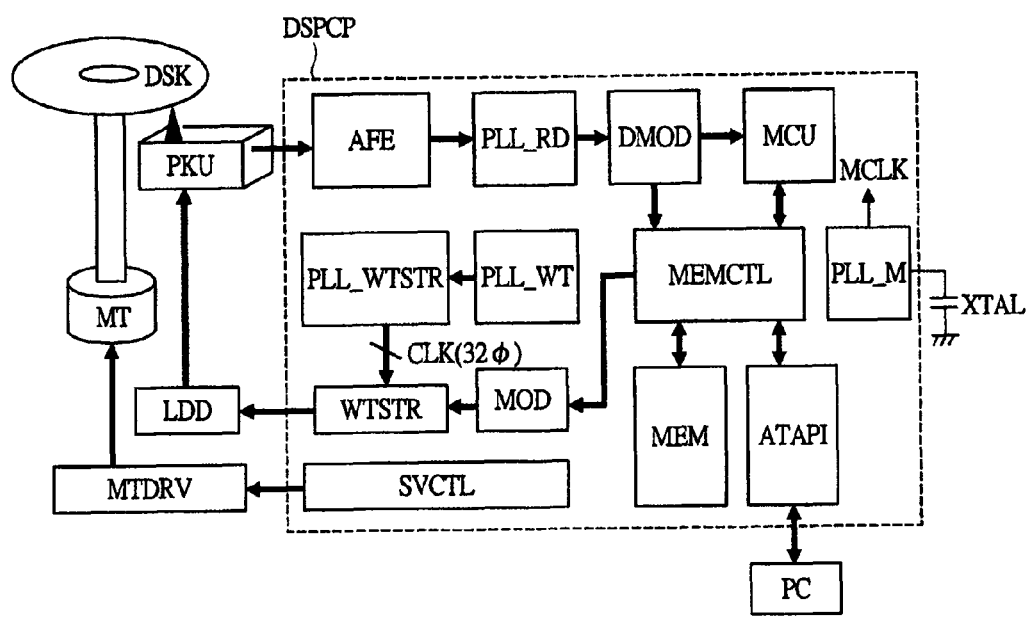
FIG. 7 is a block diagram illustrating an exemplary configuration of an optical disk system to which the semiconductor integrated circuit device according to the first embodiment of the present invention is applied.

FIG. 7 is a block diagram illustrating an exemplary configuration of an optical disk system to which the semiconductor integrated circuit device according to the first embodiment of the present invention is applied. The optical disk system shown in FIG. 7 includes, for instance, an optical disk DSK, a motor unit MT, a pickup unit PKU, a laser diode driver LDD, a motor driver MTDRV, an optical disk control chip DSPCP, and a personal computer PC. The DSK is, for example, a Compact Disc (CD), a DVD, or a Blu-ray disc. The MT rotates the DSK in accordance with a control signal supplied from the MTDRV. The PKU uses laser light from the LDD to read information from or write information onto the DSK. The PKU includes, for instance, a circuit that detects the reflection of laser light from the DSK and generates an electrical signal accordingly. The LDD outputs laser light in accordance with a laser control signal output from the DSPCP.

The optical disk control chip DSPCP includes an analog front-end circuit AFE, a demodulation circuit DMOD, a processor circuit MCU, a memory control circuit MEMCTL, a memory circuit MEM, a modulation circuit MOD, a servo control circuit SVCTL, an interface circuit ATAPI, a write strategy circuit WTSTR, and four different PLL circuits PLL_M, PLL_RD, PLL_WT, PLL_WTSTR. The PLL_M generates a master clock signal MCLK (having a frequency, for instance, of 160 MHz), which serves as a reference clock signal for the MCU and various other circuits, by multiplying a clock signal having a frequency of approximately 10 MHz, which is based on an externally coupled crystal oscillator XTAL.

The AFE receives an electrical signal, which contains, for instance, a wobble signal, from the pickup unit PKU, and subjects the received electrical signal to signal processing such as filtering. The PLL_RD reads a clock signal and a data signal from an output signal of the AFE (that is, a read data signal obtained from the DSK). The DMOD demodulates the data signal read by the PLL_RD, and stores the demodulated data signal in the MEM through the MEMCTL. The demodulated data signal is transferred to the PC through the ATAPI or other interface circuit.

Meanwhile, a write data signal generated by the PC is stored in the MEM through the ATAPI and MEMCTL. The modulation circuit MOD acquires the write data signal, which is stored in the MEM, through the MEMCTL, modulates the write data signal, and outputs the modulated write data signal to the WTSTR. The PLL_WT generates a reference clock signal for a write. The PLL_WTSTR receives the reference clock signal from the PLL_WT and generates a multi-phase or other clock signal. The WTSTR outputs a laser control signal, which has a pulse adjusted in the directions of amplitude and time, to the LDD for the purpose of performing an optimum write in accordance, for instance, with the type of the optical disk DSK (for the purpose of forming optimum pits). The aforementioned multi-phase clock signal from the PLL_WTSTR is used to adjust the direction of time of the laser control signal.

<Overview of the PLL Circuits>

Figure 8A:
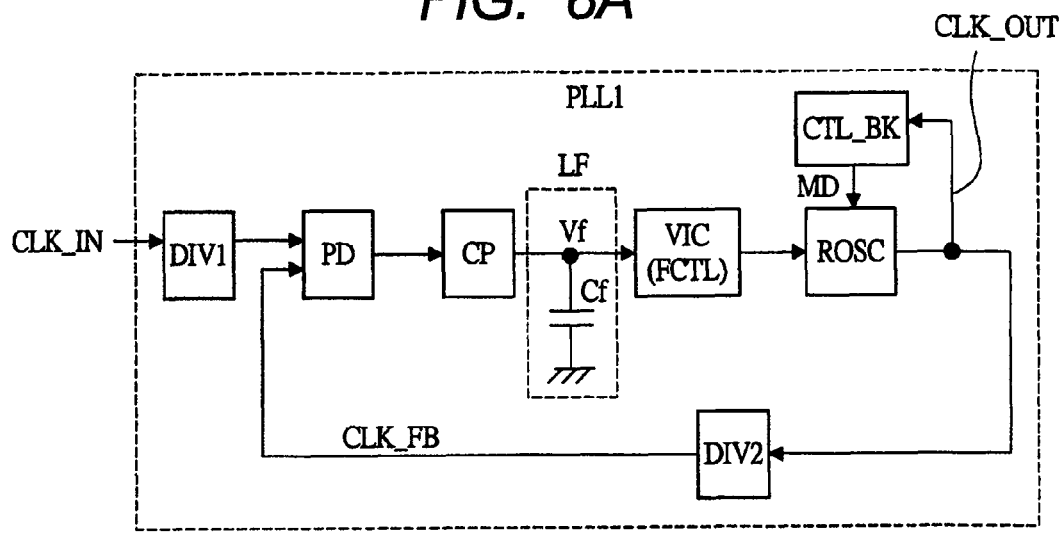
FIG. 8A is a block diagram illustrating an exemplary configuration of a PLL circuit contained in an optical disk control chip within the optical disk system shown in FIG. 7.
Figure 8B:
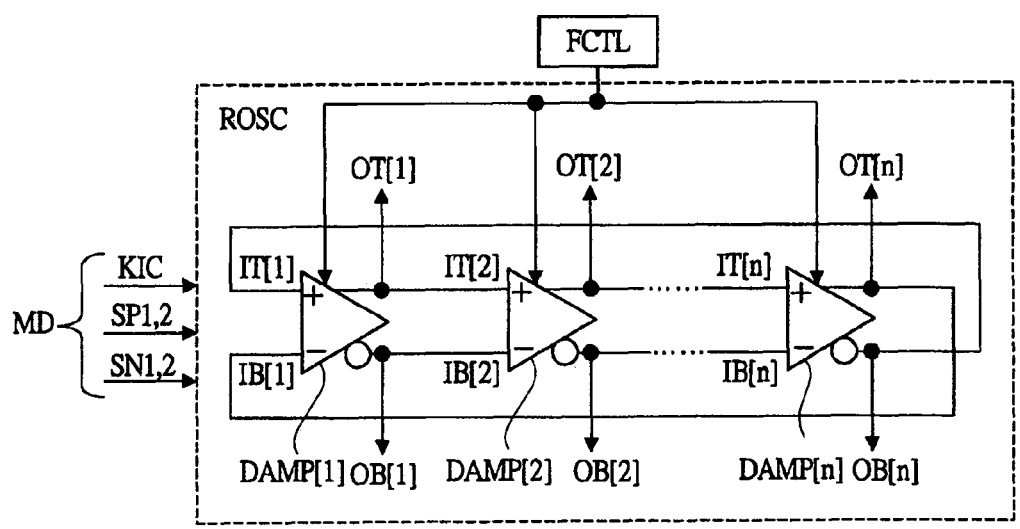
FIG. 8B is a circuit block diagram illustrating an exemplary configuration of a ring oscillator circuit included in FIG. 8A.

FIG. 8A is a block diagram illustrating an exemplary configuration of a PLL circuit contained in the optical disk control chip DSPCP within the optical disk system shown in FIG. 7. FIG. 8B is a circuit block diagram illustrating an exemplary configuration of a ring oscillator circuit included in FIG. 8A. The configuration of the PLL circuit (PLL1) shown in FIG. 8A is an exemplary configuration of the PLL_M, PLL_WT, and PLL_WTSTR shown in FIG. 7. The PLL1 shown in FIG. 8A includes, for instance, frequency divider circuits DIV1, DIV2, a phase comparator circuit PD, a charge pump circuit CP, a loop filter circuit LF containing a capacitor Cf, a voltage-current converter circuit VIC containing the aforementioned frequency control circuit FCTL, a ring oscillator circuit ROSC, and a control circuit block CTL_BK.

The DIV1 frequency-divides an input clock signal CLK_IN. The PD compares the phase of the output of the DIV1 against the phase of a feedback clock signal CLK_FB. The CP charges or discharges the Cf in accordance with the result of phase comparison by the PD. The VIC generates a current in accordance with an output voltage Vf of the Cf. The ROSC oscillates at a frequency corresponding to the current generated from the VIC, and outputs an output clock signal CLK_OUT. The DIV2 frequency-divides the CLK_OUT, and feeds the result of frequency division to the PD as the CLK_FB. The CTL_BK outputs a mode setup signal MD, which selects mode 1, 2, or 3, to the ROSC in accordance, for instance, with a CLK_OUT monitoring result and external register setup, as will be described in detail later. The MD is formed by combining the oscillation start signal KIC and switch control signals SP1 (SP2), SN1 (SN2), as described earlier.

The ring oscillator circuit ROSC includes n cascaded differential amplifier circuits DAMP[1]-DAMP[n] as shown in FIG. 8B. The differential amplifier circuits DAMP[1]-DAMP[n] are cascaded in such a manner that the positive output node and negative output node (OT[1] and OB[1]) of one differential amplifier circuit (e.g., DAMP[1]) are respectively coupled to the positive input node and negative input node (IT[2] and IB[2]) of the succeeding differential amplifier circuit (e.g., DAMP[2]). The positive output node OT[n] and negative output node OB[n] of the last differential amplifier circuit DAMP[n] are respectively fed back to the negative input node IB[1] and positive input node IT[1] of the first differential amplifier circuit DAMP[1]. The differential amplifier circuit described with reference to FIGS. 1A, 1B, 3A, 3B, and 4 is applied to each of the differential amplifier circuits DAMP[1]-DAMP[n]. When, for instance, the PLL_WTSTR shown in FIG. 7 generates a 32-phase clock signal, the symbol n of the differential amplifier circuits DAMP[1]-DAMP[n] is 16. Thus, a multi-phase clock signal is derived from the positive output nodes OT[1]-OT[16] and negative output nodes OB[1]-OB[16] of the differential amplifier circuits DAMP[1]-DAMP[16].

When data is to be written onto the optical disk DSK shown in FIG. 7, for example, a CAV (constant angular velocity) method is used. When the CAV method is used, it is necessary that write speed be continuously varied so as to continuously write data on inner tracks to outer tracks of the DSK while the DSK is rotated at a constant speed. The write speed greatly varies with the type of the optical disk DSK. For example, the write speed varies from approximately 16 MHz, which corresponds to CD 4X, to approximately 800 MHz, which corresponds to Blu-ray disc 12X. It is therefore preferred that the PLL_WTSTR, for example, be capable of handling the above-mentioned wide variable frequency range.

However, when the high-frequency side of the ring oscillator circuit ROSC is provided with an increased number of differential amplifier circuits, it is demanded that each differential amplifier circuit operate faster (by shortening propagation delay time). The gain of each differential amplifier circuit decreases due to the inverse relationship between frequency and gain. Thus, an oscillation start failure is likely to occur. The use of the semiconductor integrated circuit device (differential amplifier circuit) according to the present embodiment makes it possible to cover the above-mentioned wide variable frequency range and avoid an oscillation start failure. In this respect, applying the differential amplifier circuit according to the present embodiment to the PLL_WTSTR is beneficial because the PLL_WTSTR needs to include a larger number of differential amplifier circuits than the PLL_M and PLL_WT. When oscillation is to be started, the oscillation start signal KIC need not always be input into all the differential amplifier circuits of the ROSC. For example, oscillation may be started by inputting the oscillation start signal KIC into some of the differential amplifier circuits. In other words, the PMOS transistors MPk1, MPk2 for starting oscillation may be removed from some differential amplifier circuits, depending on the case.

Further, as a comparative example, it is possible to conceive a scheme that covers a wide variable frequency range by designing the ROSC especially for the high-frequency side of the frequency range and covering the low-frequency side as well by frequency-dividing frequencies within the frequency range. However, as the PLL_WTSTR needs to generate a multi-phase clock signal, the above scheme cannot be established with ease. It is therefore preferred that the ROSC for the PLL_WTSTR cover a wide variable frequency range. In this respect, too, applying the differential amplifier circuit according to the present embodiment to the PLL_WTSTR is beneficial.

Figure 9:
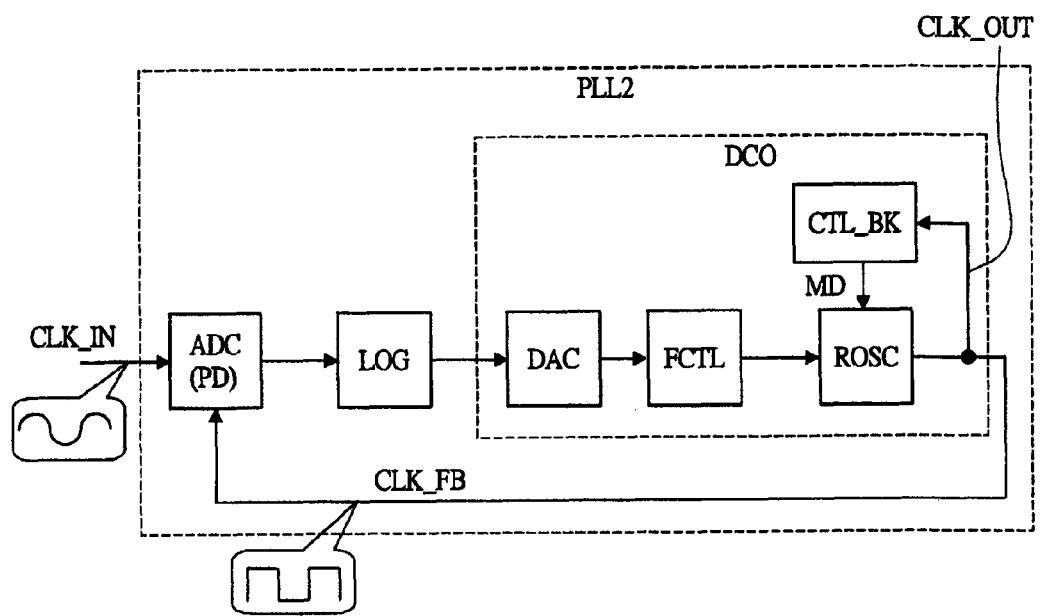
FIG. 9 is a block diagram illustrating an exemplary configuration of another PLL circuit contained in the optical disk control chip within the optical disk system shown in FIG. 7.

FIG. 9 is a block diagram illustrating an exemplary configuration of another PLL circuit contained in the optical disk control chip DSPCP within the optical disk system shown in FIG. 7. The configuration of the PLL circuit (PLL2) shown in FIG. 9 is an exemplary configuration of the PLL_RD shown in FIG. 7. The PLL2 shown in FIG. 9 includes an analog-to-digital converter circuit ADC, a control logic circuit LOG, a digital-to-analog converter circuit DAC, a frequency control circuit FCTL, a ring oscillator circuit ROSC, and a control circuit block CTL_BK. The configuration of the PLL2 is based on a VCO (voltage controlled oscillator) although the configuration of the aforementioned PLL1 is based on a DCO (digitally controlled oscillator).

The ADC functions as a phase comparator circuit PD, and outputs the phase difference between an input clock signal CLK_IN and a feedback clock signal CLK_FB in the form of a digital signal. The LOG receives the digital signal from the ADC, subjects the received digital signal to predetermined arithmetic processing to make it suitable for the succeeding DAC, and outputs the processed digital signal. The DAC receives the processed digital signal from the LOG and outputs an analog signal. The FCTL outputs a current corresponding to the analog signal. The ROSC allows this current to control its oscillation frequency, and outputs an output clock signal CLK_OUT. The CLK_OUT is then fed back to the ADC as the CLK_FB. As is the case shown in FIG. 8A, the CTL_BK monitors the CLK_OUT and outputs a mode setup signal MD.

For example, the PLL_RD shown in FIG. 7 inputs an electrical signal, which includes, for instance, a wobble signal read from the optical disk DSK, as the CLK_IN, and generates the CLK_OUT, which serves as a read clock signal, in accordance with the CLK_IN. As the frequency of the CLK_IN varies depending on the location of a track (inner or outer) of the DSK and the type of the DSK, the ROSC needs to be configured in such a manner as to handle a wide variable frequency range. Consequently, applying the differential amplifier circuit according to the present embodiment to the ROSC is beneficial.

<Overview of the Control Circuit Block for the Ring Oscillator Circuit>

Figure 10:
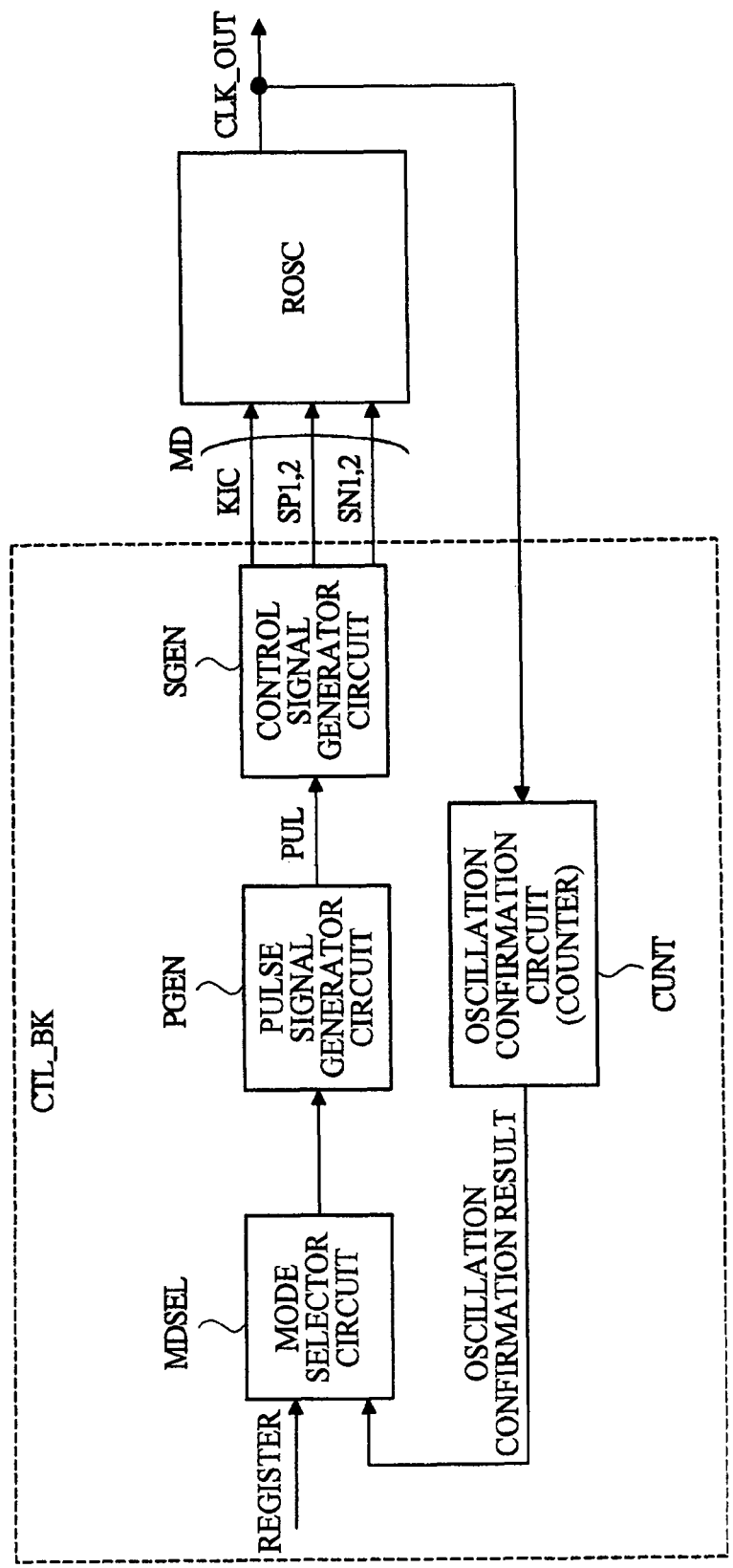
FIG. 10 is a block diagram illustrating an exemplary configuration of a control circuit block for the PLL circuits shown in FIGS. 8A and 9.

FIG. 10 is a block diagram illustrating an exemplary configuration of the control circuit block CTL_BK for the PLL circuits shown in FIGS. 8A and 9. The control circuit block CTL_BK shown in FIG. 10 includes a mode selector circuit MDSEL, a pulse signal generator circuit PGEN, a control signal generator circuit SGEN, and an oscillation confirmation circuit CUNT. The CUNT includes a counter circuit and performs a counting operation in accordance with an output clock signal CLK_OUT from the ring oscillator circuit ROSC. When the count is not smaller than a predetermined value, the CUNT concludes that oscillation is taking place. In some cases, the CUNT recognizes the oscillation frequency of the ROSC in accordance with the count.

The MDSEL selects a mode in accordance with external register setup and an oscillation confirmation result produced by the CUNT. When, for instance, a register setting is changed by external firmware, the MDSEL selects mode 1, 2, or 3, which are described with reference, for instance, to FIGS. 1A and 1B. When an oscillation confirmation result indicates that oscillation is taking place, the MDSEL switches again, for instance, to mode 1 for starting oscillation. Further, in some cases, the MDSEL recognizes the oscillation frequency of the ROSC in accordance with an oscillation confirmation result and automatically switches between mode 2 and mode 3. The pulse signal generator circuit PGEN generates a pulse signal in accordance with a mode selected by the MDSEL. The control signal generator circuit SGEN generates a mode setup signal MD (a combination of the oscillation start signal KIC and switch control signals SP1 (SP2), SN1 (SN2)) for mode 1, 2, or 3 by using the pulse signal generated from the PGEN, and outputs the mode setup signal MD to the ROSC.

Figure 11:
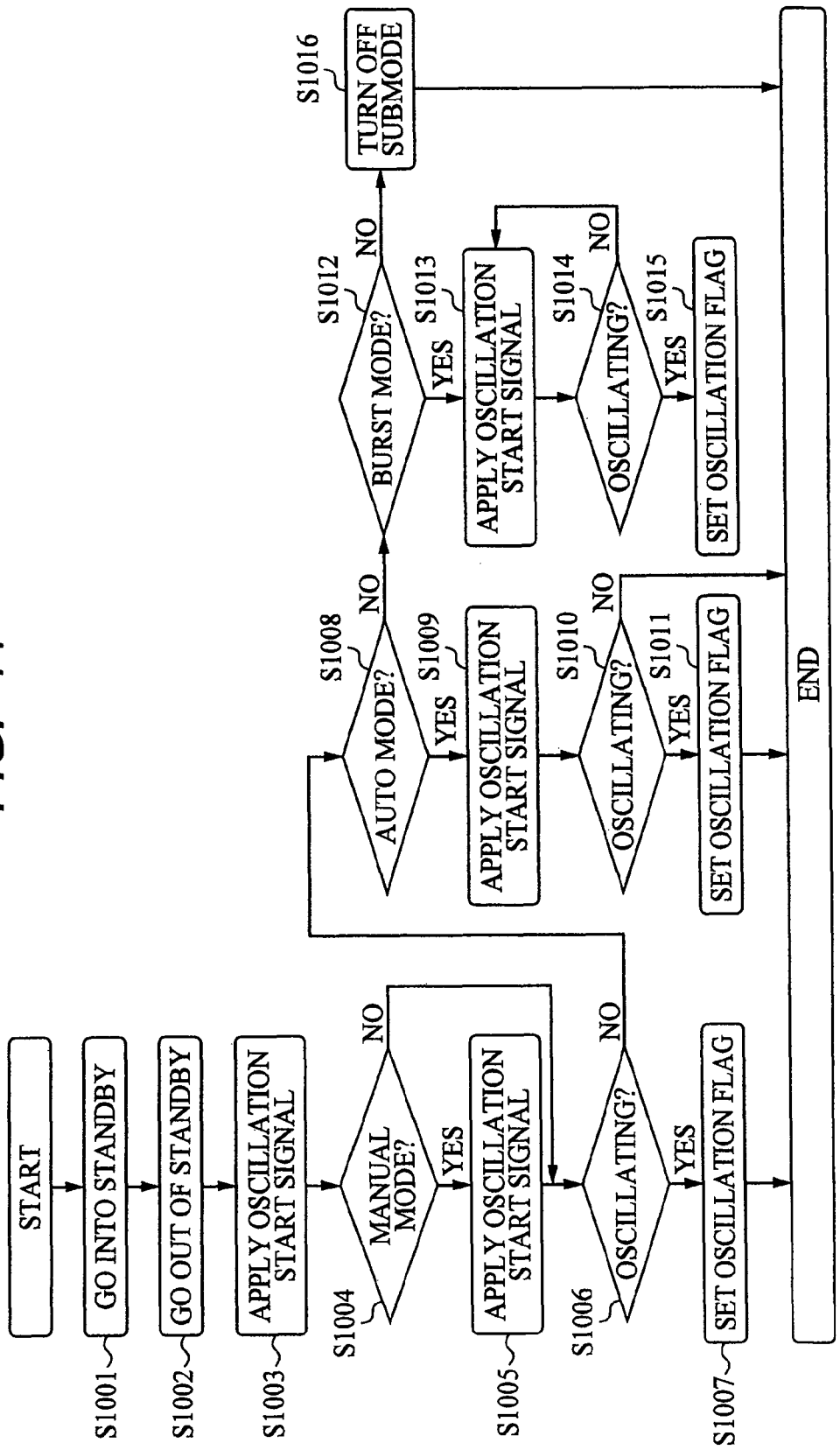
FIG. 11 is a flowchart illustrating an example of a process that is performed in an oscillation start mode by the control circuit block shown in FIG. 10.
Figure 12:
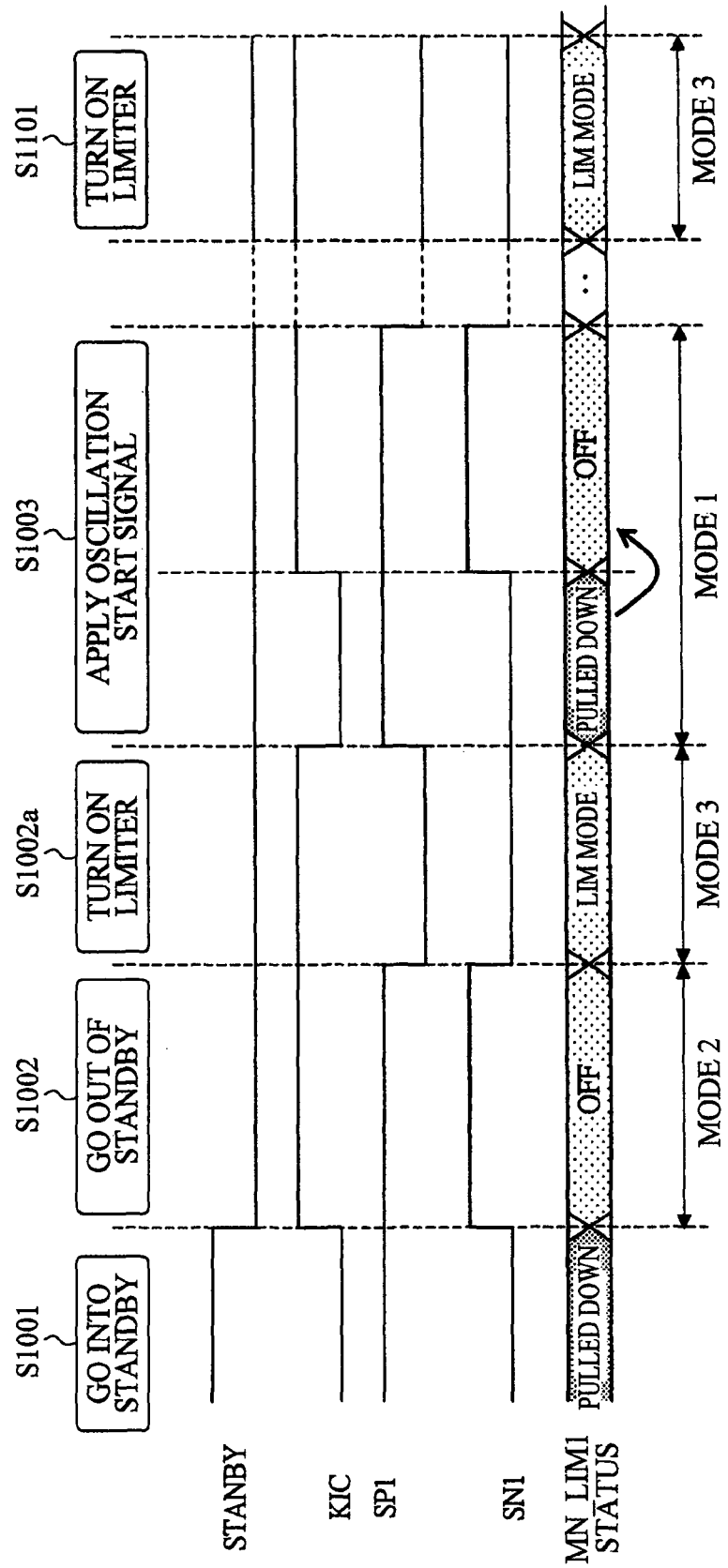
FIG. 12 is a supplementary diagram for FIG. 11.

FIG. 11 is a flowchart illustrating an example of a process that is performed in an oscillation start mode (mode 1) by the control circuit block CTL_BK shown in FIG. 10. FIG. 12 is a supplementary diagram for FIG. 11. In the following description, it is assumed that the differential amplifier circuit DAMP_A1 shown in FIG. 4 is used. As indicated in FIG. 11, the oscillation start mode (mode 1) permits the selection of one of three different submodes. The first submode is a manual mode. When, in the manual mode, an oscillation start instruction is received upon external register setup, the oscillation start signal KIC is generated once without regard to the oscillation confirmation result produced by the oscillation confirmation circuit CUNT. The second submode is an auto mode. In the auto mode, the KIC is generated once when the oscillation confirmation result indicates that no oscillation is taking place. The third submode is a burst mode. In the burst mode, the KIC is generated repeatedly until the oscillation confirmation result indicates that oscillation is taking place. These three submodes can be turned off.

These submodes are used as indicated in FIG. 11. First of all, the control circuit block CTL_BK puts the ring oscillator circuit ROSC on standby (step S1001). In this standby state, as shown in FIG. 12, the oscillation start signal KIC is placed at "L" level, the switch control signal SP1 is placed at "H" level, and the switch control signal SN1 is placed at "L" level. Thus, the NMOS transistor MN_LIM1 having the limiter function turns on accordingly and is pulled down to GND level. In the resulting state, a predetermined current is supplied to the differential amplifier circuit DAMP_µl through the frequency control circuit FCTL.

Referring again to FIG. 11, the CTL_BK maintains the above-mentioned standby state for a predetermined period of time and then clears the standby state (step S1002). When the standby state is cleared, the levels of the KIC, SP1, and SN1 are set in mode 2 as shown in FIG. 12. The MN_LIM1 is then turned off accordingly. Next, the CTL_BK applies the oscillation start signal KIC by using the setup in mode 1 (step S1003). Here, although this is not restrictive, the CTL_BK first enables the limiter function (step S1002a) as shown in FIG. 12 by using the setup in mode 3, and then applies the KIC (step S1003).

When the oscillation start signal KIC is applied (step S1003), control is exercised as shown in FIG. 12 to maintain the switch control signal SP1 at "H" level and switch the oscillation start signal KIC and switch control signal SN1 from "L" level to "H" level. Accordingly, control is further exercised to switch the MN_LIM1 from the pulled-down state to the off state. As described above, the MN_LIM1's transition from the pulled-down state to the off state generates a trigger for starting oscillation. After the trigger is generated, the MN_LIM1 remains in the off state for a predetermined period of time. While the MN_LIM1 is in the off state, the limiter function is disabled for oscillation stabilization. As step S1003 is performed while no limitation is imposed on amplitude, oscillation can be started with increased certainty.

After completion of step S1003, the CTL_BK judges, as shown in FIG. 11, whether an oscillation start instruction is issued with the aforementioned manual mode selected as a submode (step S1004). If the oscillation start instruction is issued, step S1005 is performed to apply the oscillation start signal KIC, as is the case with step S1003. If, on the other hand, the oscillation start instruction is not issued, the CTL_BK proceeds to step S1006. In step S1006, the CTL_BK judges in accordance with the oscillation confirmation result produced by the oscillation confirmation circuit CUNT whether oscillating is taking place. If oscillation is taking place, the CTL_BK sets an oscillation flag and finishes its process (step S1007). If, on the other hand, no oscillation is taking place, the CTL_BK proceeds to step S1008.

In step S1008, the CTL_BK judges whether the aforementioned auto mode is selected as a submode. If, the auto mode is selected, the CTL_BK proceeds to step S1009 and applies the oscillation start signal KIC, as is the case with step S1003. The CTL_BK then performs step S1010 to verify the oscillation confirmation result produced by the oscillation confirmation circuit CUNT. If oscillation is taking place, the CTL_BK sets the oscillation flag and finishes its process (step S1011). If, on the other hand, the judgment result obtained in step S1008 does not indicate that the auto mode is selected, the CTL_BK proceeds to step S1012.

In step S1012, the CTL_BK judges whether the aforementioned burst mode is selected as a submode. If the burst mode is selected, the CTL_BK applies the oscillation start signal KIC repeatedly until the oscillation confirmation result indicates that oscillation is taking place (steps S1013 and S1014), as is the case with step S1003. If the oscillation confirmation result indicates that oscillation is taking place, the CTL_BK sets the oscillation flag and finishes its process (step S1015). If, on the other hand, the judgment result obtained in step S1012 does not indicate that the burst mode is selected, the CTL_BK proceeds to step S1016, concludes that no submode is selected, and finishes its process. Subsequently, as shown in FIG. 12, when the oscillation is stabilized, the CTL_BK performs step S1101 to enable the limiter function (mode 3) as needed depending on the oscillation frequency.

When the above-described control circuit block CTL_BK is used, a manual process can be performed to start oscillation in accordance with an external instruction or an internal decision. Under normal conditions, oscillation can be properly invoked by using the manual mode. However, increased safety assurance is provided by using the auto mode and burst mode in combination with the oscillation confirmation circuit CUNT. The CTL_BK described above can be implemented with a logic circuit. Further, the overhead of a circuit area, for example, does not cause any particular problem. Therefore, it can be said that the advantage of providing the auto mode and burst mode is greater than the disadvantage of providing them.

As described above, the use of the semiconductor integrated circuit device according to the first embodiment of the present invention representatively enables the ring oscillator circuit to properly perform its oscillation. It also allows the ring oscillator circuit to expand the range of oscillation frequency variation. Here, it is assumed that the exemplary configuration is provided with modes 1 to 3 as shown, for instance, in FIGS. 1A and 1B. However, as mentioned earlier, adequate effects are produced by using mode 3 alone. Further effects will be produced by combining mode 2, mode 1, or both of these modes with mode 3. The employed configuration does not always need all three modes.

Second Embodiment

Figure 13:
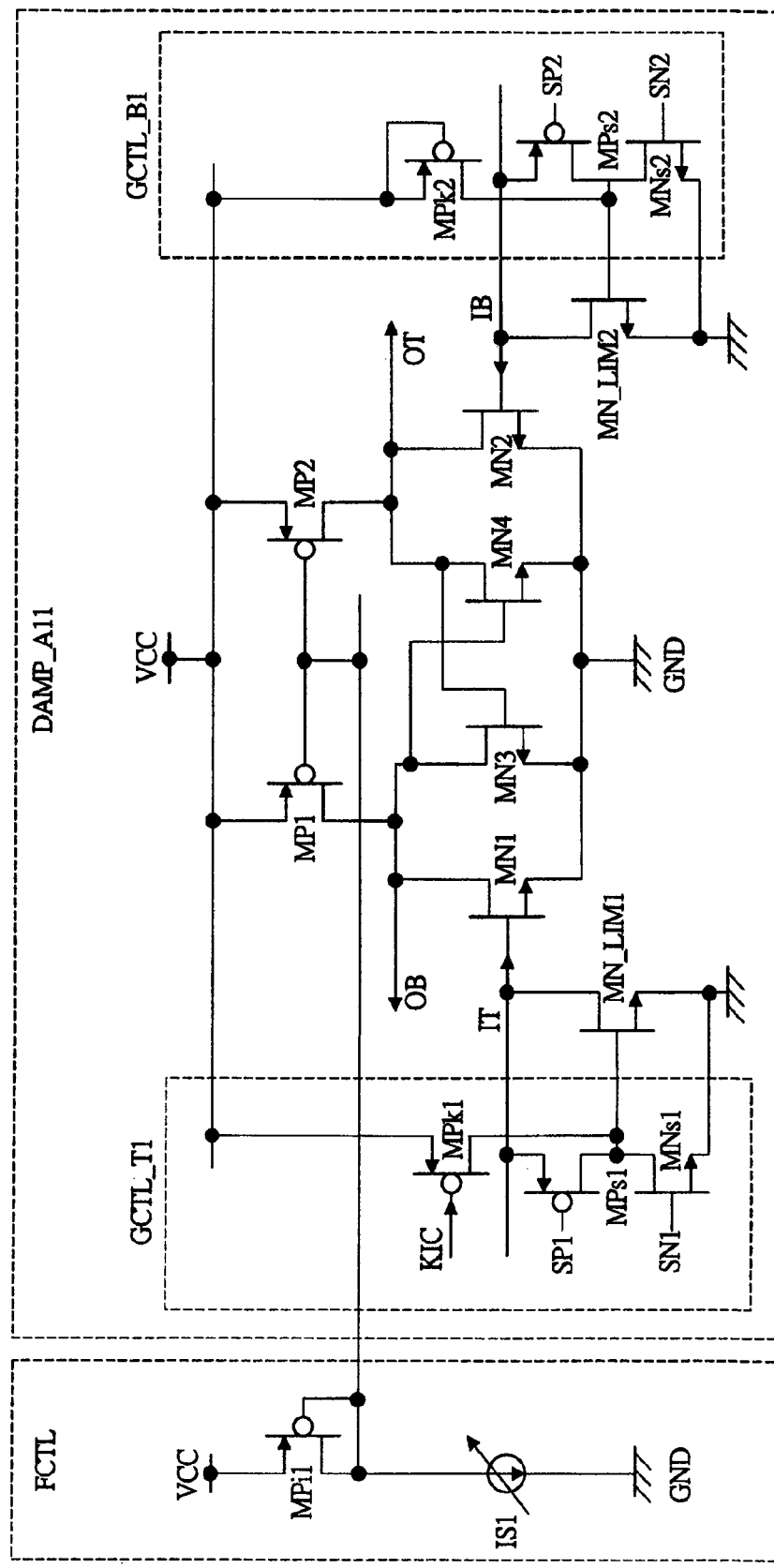
FIG. 13 is a circuit diagram illustrating an exemplary configuration of the semiconductor integrated circuit device according to a second embodiment of the present invention.

A second embodiment of the present invention will now be described with reference to further details of the differential amplifier circuit DAMP_A1 shown in FIG. 4. FIG. 13 is a circuit diagram illustrating an exemplary configuration of the semiconductor integrated circuit device according to the second embodiment of the present invention. The differential amplifier circuit (semiconductor integrated circuit device) DAMP_A11 shown in FIG. 13 differs from the DAMP_A1, which is shown in FIG. 4 and described earlier, in that an NMOS transistor MN4 is added to the inverter circuit IV1 with an NMOS transistor MN3 added to the inverter circuit IV2. The other elements are the same as indicated in FIG. 4 and will not be described in detail.

The MN4 is configured by coupling its source to a ground supply voltage GND, its drain to a positive output node OT, and its gate to a negative output node OB. Conversely, the MN3 is configured by coupling its source to the GND, its drain to the negative output node OB, and its gate to the positive output node OT. Therefore, the IV1 of the DAMP_A1 is implemented by the MN4 and the PMOS transistor MP2, which serves as a load current source for the drain of the MN4, and the IV2 of the DAMP_A1 is implemented by the MN3 and the PMOS transistor MP1, which serves as a load current source for the drain of the MN3.

The transistor sizes of the limiting NMOS transistors MN_LIM1, MN_LIM2 are, for example, approximately 1/10 to 1/6 the transistor sizes of the driving NMOS transistors MN1, MN2. Further, the switching NMOS transistors MNs1, MNs2 and PMOS transistors MPs1, MPs2, MPk1, MPk2 can be even smaller than the MN_LIM1, MN_LIM2 and reduced to the minimum transistor size.

As described above, the use of the semiconductor integrated circuit device according to the second embodiment of the present invention representatively enables the ring oscillator circuit to properly perform its oscillation, as is the case with the first embodiment. It also allows the ring oscillator circuit to expand the range of oscillation frequency variation. Further, the differential amplifier circuit (inverter circuits IV1, IV2) shown in FIG. 4, which was described in connection with the first embodiment, can be implemented in a small circuit area.

Third Embodiment

Figure 14:
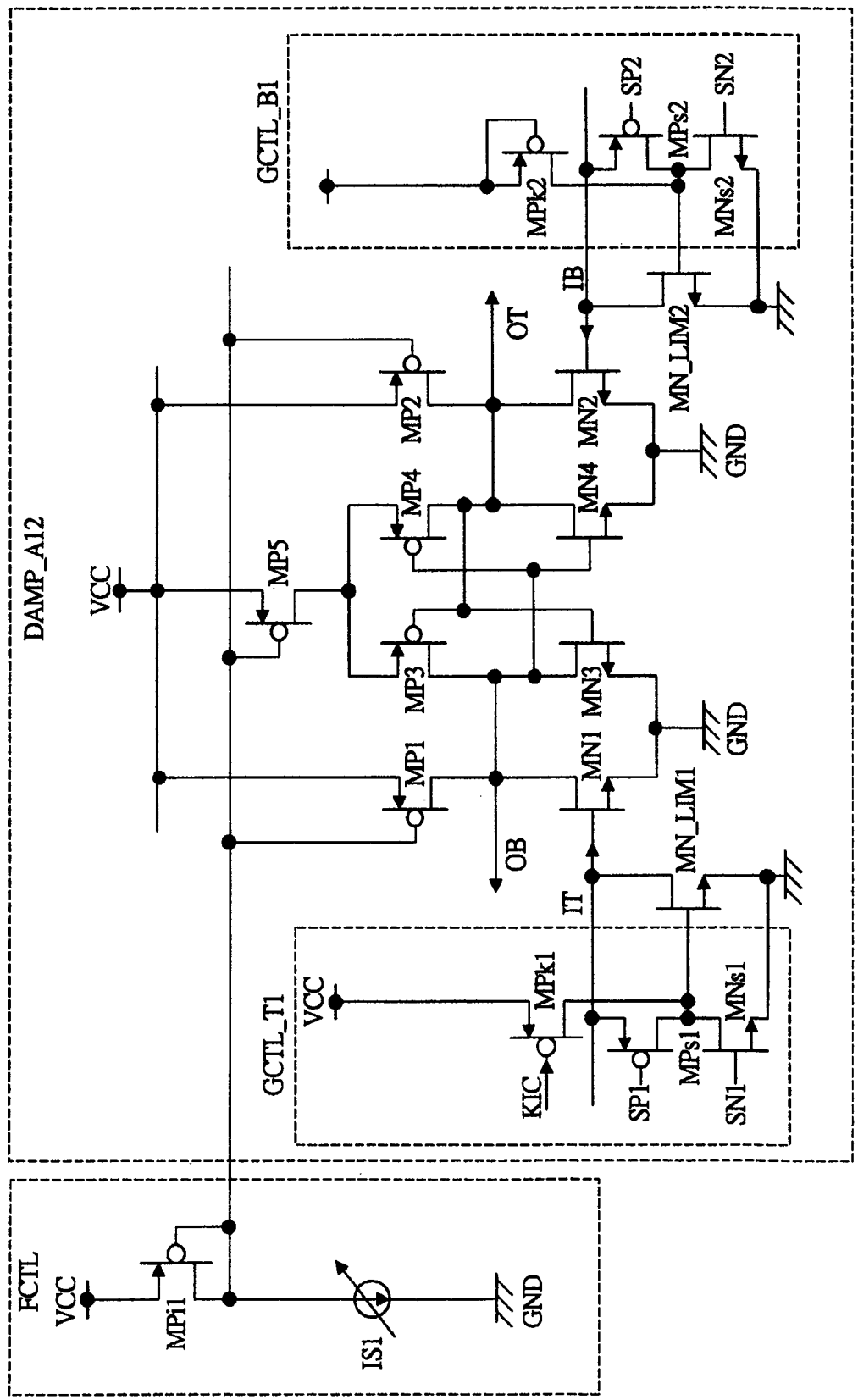
FIG. 14 is a circuit diagram illustrating an exemplary configuration of the semiconductor integrated circuit device according to a third embodiment of the present invention.

A third embodiment of the present invention will now be described with reference to further details of the differential amplifier circuit DAMP_A1 shown in FIG. 4, which differ from those indicated in FIG. 13. FIG. 14 is a circuit diagram illustrating an exemplary configuration of the semiconductor integrated circuit device according to the third embodiment of the present invention. The differential amplifier circuit (semiconductor integrated circuit device) DAMP_A12 shown in FIG. 14 differs from the DAMP_A1, which is shown in FIG. 4 and described earlier, in that NMOS transistors MN3, MN4 and PMOS transistors MP3-MP5 are added to the inverter circuits IV1, IV2. The other elements are the same as indicated in FIG. 4 and will not be described in detail.

The MN4 is configured by coupling its source to a ground supply voltage GND, its drain to a positive output node OT, and its gate to a negative output node OB. Conversely, the MN3 is configured by coupling its source to the GND, its drain to the negative output node OB, and its gate to the positive output node OT. Further, the sources of the MP4 and MP3 are commonly coupled. The MP4 is configured by coupling its drain to the OT and its gate to the OB. Conversely, the MP3 is configured by coupling its drain to the OB and its gate to the OT. The MP5 is configured by coupling its source to a supply voltage VCC, its drain to the sources of the MP3 and MP4, and its gate to the gate (and drain) of a PMOS transistor MPi1 included in the frequency control circuit FCTL. Therefore, the IV1 of the DAMP_A1 shown in FIG. 4 is implemented by an inversion of the MP4 and MN4, which use a current from the MP5 as an operating current, and the IV2 of the DAMP_A1 is implemented by an inversion of the MP3 and MN3, which use a current from the MP5 as an operating current.

The use of the above-described exemplary configuration makes it possible to improve the rise characteristic of an output signal as compared with the earlier-described exemplary configuration shown in FIG. 13 and provide, for example, enhanced waveform quality. More specifically, the earlier-described exemplary configuration shown in FIG. 13 uses only the PMOS transistor MP1 or MP2 for driving purposes when the output signal rises. Therefore, the rise characteristic may deteriorate to degrade waveform quality particularly in mode 2 (in which the limiter function is disabled). In the exemplary configuration shown in FIG. 14, on the other hand, the MP3 or MP4 is used in addition to the MP1 or MP2 for driving purposes. This improves the rise characteristic. Improving the rise characteristic in this manner improves the jitter characteristic and duty characteristic of the ring oscillator circuit.

As described above, the use of the semiconductor integrated circuit device according to the third embodiment of the present invention representatively enables the ring oscillator circuit to properly perform its oscillation, as is the case with the first embodiment. It also allows the ring oscillator circuit to expand the range of oscillation frequency variation. Further, the third embodiment provides enhanced waveform quality as compared with the first embodiment and expands the range of frequency variation.

Fourth Embodiment

Figure 15:
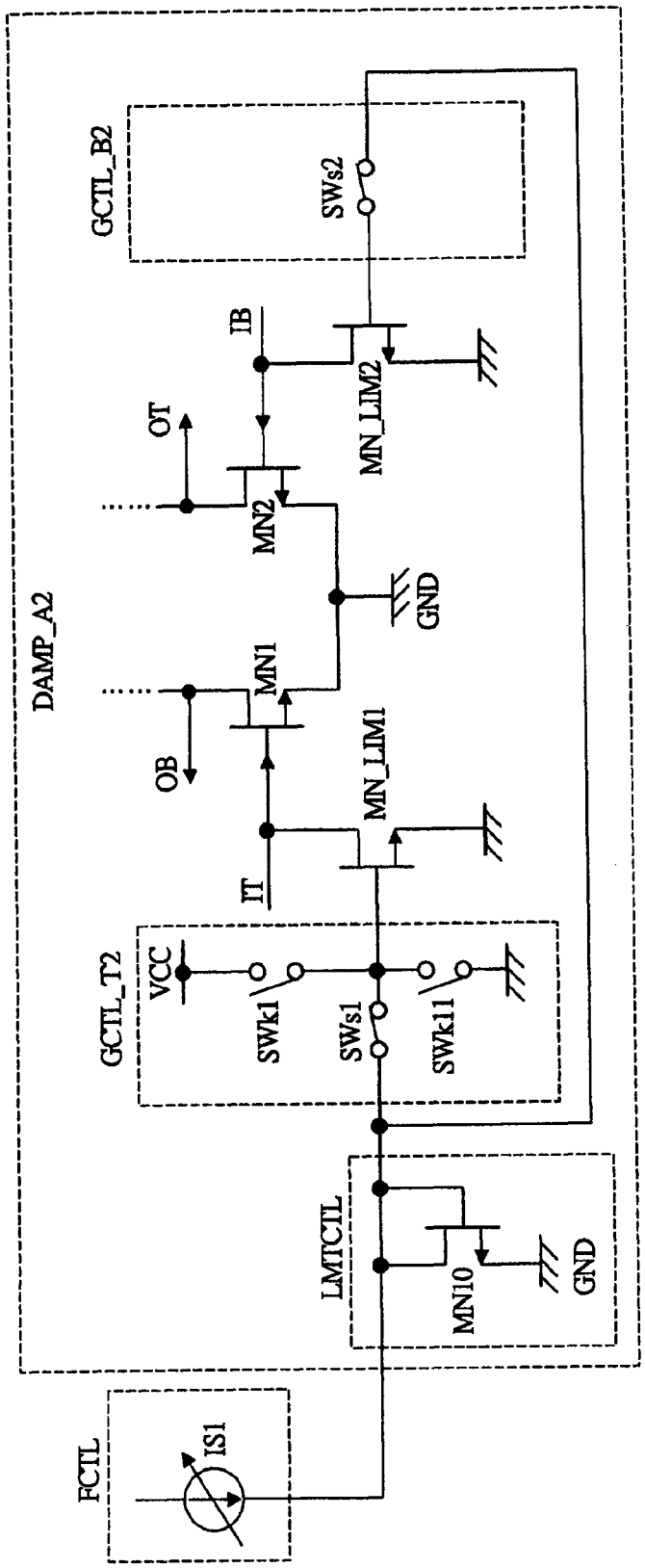
FIG. 15 is a circuit diagram illustrating an exemplary configuration of essential parts of the semiconductor integrated circuit device according to a fourth embodiment of the present invention.

For example, FIG. 4, which relates to the first embodiment, shows an exemplary configuration in which the limiter function is implemented by a diode. A fourth embodiment of the present invention will now be described with reference to an exemplary configuration in which the limiter function is implemented by a variable resistor as described with reference to FIGS. 1A and 1B. FIG. 15 is a circuit diagram illustrating an exemplary configuration of essential parts of the semiconductor integrated circuit device according to the fourth embodiment of the present invention. The differential amplifier circuit (semiconductor integrated circuit device) DAMP_A2 shown in FIG. 15 includes gate control circuits GCTL_T2, GCTL_B2 and a limit amount control circuit LMTCTL in addition to the NMOS transistors MN1, MN2, which form a differential pair as described with reference, for instance, to FIGS. 1A and 1B, and the NMOS transistors MN_LIM1, MN_LIM2, which have the limiter function.

The LMTCTL includes an NMOS transistor MN10 that is diode-coupled (with the gate and drain coupled together). A current from the frequency control circuit FCTL is supplied between the source and drain of the MN10. In the case of the FCTL shown, for instance, in FIG. 4, a current that is fed from the PMOS transistor MPi1 and looped back through the current mirror circuit is actually supplied between the source and drain of the MN10. This ensures that the gate voltage (drain voltage) of the MN10 increases with an increase in the current from the FCTL (namely, with an increase in a frequency setting).

The GCTL_T2 includes a switch circuit SWk1, a switch circuit SWs1, and a switch circuit SWk11. The switch circuit SWk1 is coupled between the gate of the MN_LIM1 and a supply voltage VCC. The switch circuit SWs1 is coupled between the gate of the MN_LIM1 and the gate (drain) of the MN10. The switch circuit SWk11 is coupled between the gate of the MN_LIM1 and a ground supply voltage GND. The GCTL_B2, on the other hand, includes a switch circuit SWs2, which is coupled between the gate of the MN_LIM2 and the gate (drain) of the MN10.

When, for instance, oscillation is to be started in the above-described configuration, control is exercised, for example, to turn off the SWs1 and SWs2, switch the SWk1 from the on state to the off state, and switch the SWk11 from the off state to the on state. This causes the MN_LIM1 to switch from the on state to the off state, thereby starting oscillation. When low-frequency oscillation (mode 2 shown in FIGS. 1A and 1B) or high-frequency oscillation (mode 3 shown in FIGS. 1A and 1B) is to be started, control is exercised to turn off the SWk1 and SWk11 and turn on the SWs1 and SWs2. The gate biases of the MN_LIM1 and MN_LIM2, which are input through the LMTCTL, then increase with an increase in oscillation frequency. Therefore, the amounts of signal amplitude limitation for the positive input node IT and negative input node IB increase with a decrease in the resistance values of the MN_LIM1 and MN_LIM2.

As linear amplitude limitation can be imposed in accordance with oscillation frequency as described above, the limiter function can be further optimized as compared with a diode method indicated, for instance, in FIG. 4. The transistor size of the MN10 in the LMTCTL is determined so that the amounts of gate bias variation are appropriate for the MN_LIM1 and MN_LIM2.

As described above, the use of the semiconductor integrated circuit device according to the fourth embodiment of the present invention representatively enables the ring oscillator circuit to properly perform its oscillation, as is the case with the first embodiment. It also allows the ring oscillator circuit to expand the range of oscillation frequency variation. Further, the fourth embodiment can provide amplitude limitation optimization and automatically provide such optimization. In other words, control is automatically exercised by using the information of the frequency control circuit FCTL. Therefore, it is not necessary to set up the resistance values of variable resistors for the MN_LIM1 and MN_LIM2 from, for instance, external firmware. Meanwhile, although the exemplary configuration of essential parts of the differential amplifier circuit is described above, the other circuit portion may be the same as the earlier-described circuit shown, for instance, in FIG. 4.

Fifth Embodiment

Figure 16:
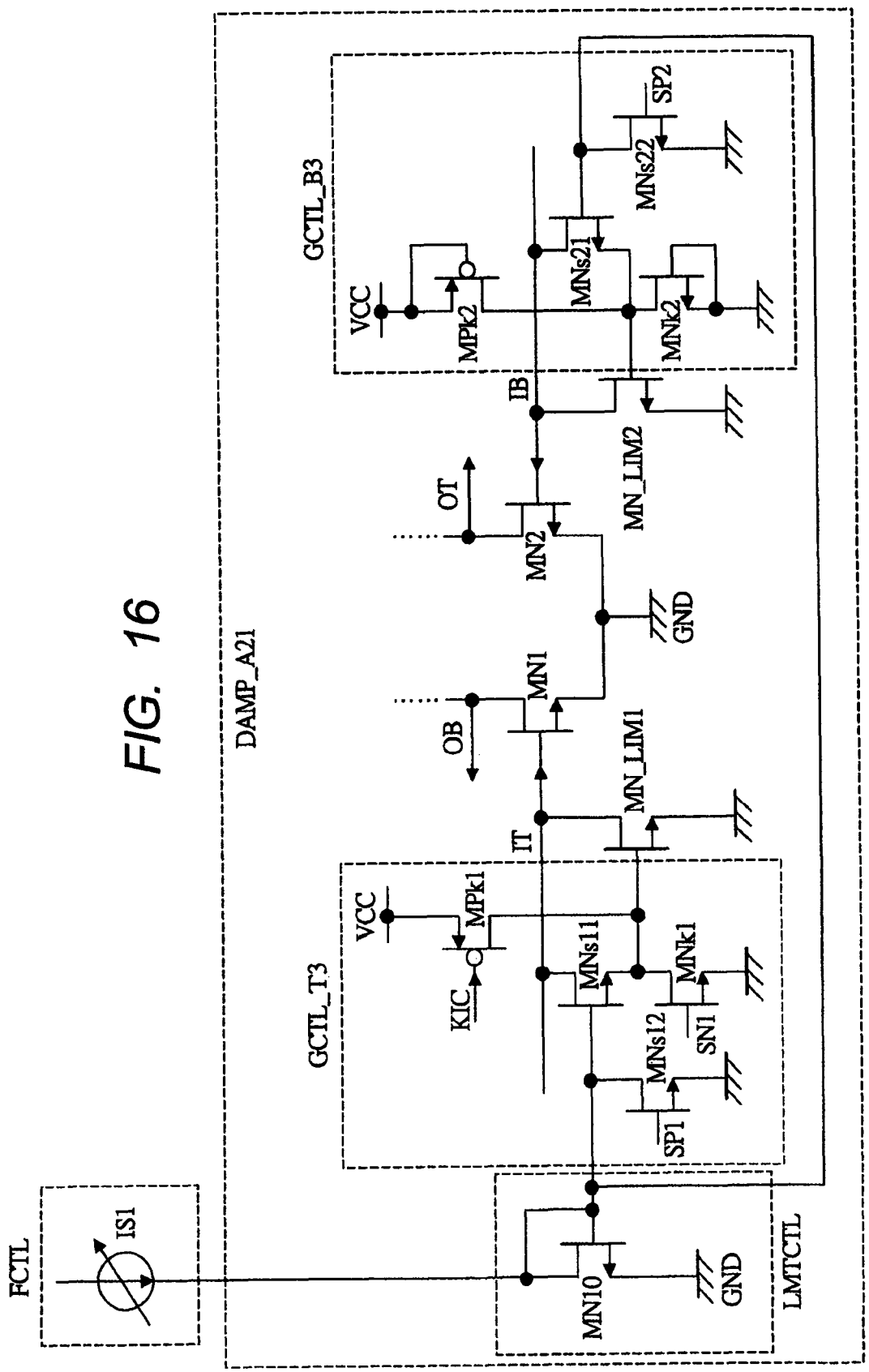
FIG. 16 is a circuit diagram illustrating an exemplary configuration of essential parts of the semiconductor integrated circuit device according to a fifth embodiment of the present invention.

A fifth embodiment of the present invention will now be described with reference to a modification of the configuration according to the fourth embodiment, which is shown in FIG. 15. FIG. 16 is a circuit diagram illustrating an exemplary configuration of essential parts of the semiconductor integrated circuit device according to the fifth embodiment of the present invention. As is the case with the exemplary configuration shown in FIG. 15, the differential amplifier circuit (semiconductor integrated circuit device) DAMP_A21 shown in FIG. 16 includes NMOS transistors MN1, MN2 that form a differential pair, NMOS transistors MN_LIM1, MN_LIM2 that have a limiter function, gate control circuits GCTL_T3, GCTL_B3, and a limit amount control circuit LMTCTL. In other words, the exemplary configuration shown in FIG. 16 differs from the exemplary configuration shown in FIG. 15 in that the gate control circuits GCTL_T2, GCTL_B2 shown in FIG. 15 are replaced by the GCTL_T3 and GCTL_B3 shown in FIG. 16. The other elements are the same as shown in FIG. 15 and will not be described in detail.

The GCTL_T3 includes a PMOS transistor MPk1 and NMOS transistors MNs11, MNs12, MNk1. The MPk1 is configured by coupling its source to a supply voltage VCC and its drain to the gate of the MN_LIM1 and by allowing its gate to input the oscillation start signal KIC. The MNs11 is configured by coupling its source to the gate of the MN_LIM1, its drain to the positive input node IT, and its gate to the gate (drain) of the NMOS transistor MN10 in the aforementioned LMTCTL. The MNs12 is configured by coupling its source to a ground supply voltage GND and its drain to the gate (drain) of the MN10 and by allowing its gate to input the switch control signal SP1. The MNk1 is configured by coupling its source to the GND and its drain to the gate of the MN_LIM1 and by allowing its gate to input the switch control signal SN1.

The GCTL_B3, on the other hand, includes a PMOS transistor MPk2 and NMOS transistors MNs21, MNs22, MNk2. The MPk2 is configured by coupling its source and gate to the VCC and its drain to the gate of the MN_LIM2. The MNs21 is configured by coupling its source to the gate of the MN_LIM2, its drain to the negative input node IB, and its gate to the gate (drain) of the MN10 in the aforementioned LMTCTL. The MNs22 is configured by coupling its source to the GND and its drain to the gate (drain) of the MN10 and by allowing its gate to input the switch control signal SP2. The MNk2 is configured by coupling its source and gate to the GND and its drain to the gate of the MN_LIM1. The MPk2 and MNk2 constantly remain in the off state and are used as a dummy to maintain symmetry with the MPk1 and MNk1 in the GCTL_T3.

When, for instance, oscillation is to be started (mode 1 shown in FIGS. 1A and 1B), the use of the above-described configuration causes, for example, the MNs12 and MNs22 to turn on due to the "H" level of the SP1 and SP2, thereby turning off the MNs11 and MNs21. When control is exercised in the resultant state to switch the KIC and SN1 from "L" level to "H" level, the MPk1 switches from the on state to the off state, causing the MNk1 to switch from the off state to the on state. Consequently, oscillation is started by exercising control so as to switch the MN-LIM1 from the on state to the off state.

When subsequent low-frequency oscillation (mode 2 shown in FIGS. 1A and 1B) or high-frequency oscillation (mode 3 shown in FIGS. 1A and 1B) is to be started, the MNs12 and MNs22 turn off due to the "L" level of the SP1 and SP2. Further, the SN1 changes to "L" level to turn off the MNk1 and then the MPk1. In the resultant state, the LMTCTL applies a voltage to the gates of the MNs11 and MNs21. Even in this instance, the on-resistances of the MNs11 and MNs21 decrease with an increase in the oscillation frequency, as is the case shown in FIG. 15. This decreases the resistance values of the MN_LIM1 and MN_LIM2, thereby increasing the amount of signal amplitude limitation. However, unlike the case shown in FIG. 15, when the on-resistances of the MNs11 and MNs21 are decreased to a certain extent, the MN_LIM1 and MN_LIM2 become equivalent to a diode. Even if the oscillation frequency is subsequently raised in this situation, the amount of signal amplitude limitation remains unchanged.

As described above, the use of the semiconductor integrated circuit device according to the fifth embodiment of the present invention representatively enables the ring oscillator circuit to properly perform its oscillation, as is the case, for instance, with the fourth embodiment. It also allows the ring oscillator circuit to expand the range of oscillation frequency variation. Further, the fifth embodiment can provide amplitude limitation optimization and automatically provide such optimization. In addition, the fifth embodiment makes it possible to set an upper limit for the amount of signal amplitude limitation. Therefore, the fifth embodiment can prevent excessive amplitude limitation and provide more optimum amplitude limitation than the fourth embodiment.

The NMOS transistors MNs11, MNs21 shown in FIG. 16 can be implemented by PMOS transistors. However, the use of PMOS transistors increases the circuit area and capacitive load. From this point of view, therefore, it is preferred that NMOS transistors be used. Meanwhile, although the exemplary configuration of essential parts of the differential amplifier circuit is described above, the other circuit portion may be the same as the earlier-described circuit shown, for instance, in FIG. 4.

While the present invention contemplated by inventors has been described in terms of preferred embodiments, the reader should understand that the invention is not limited to those preferred embodiments, but extends to various modifications that nevertheless fall within the scope of the appended claims.

Figure 18:
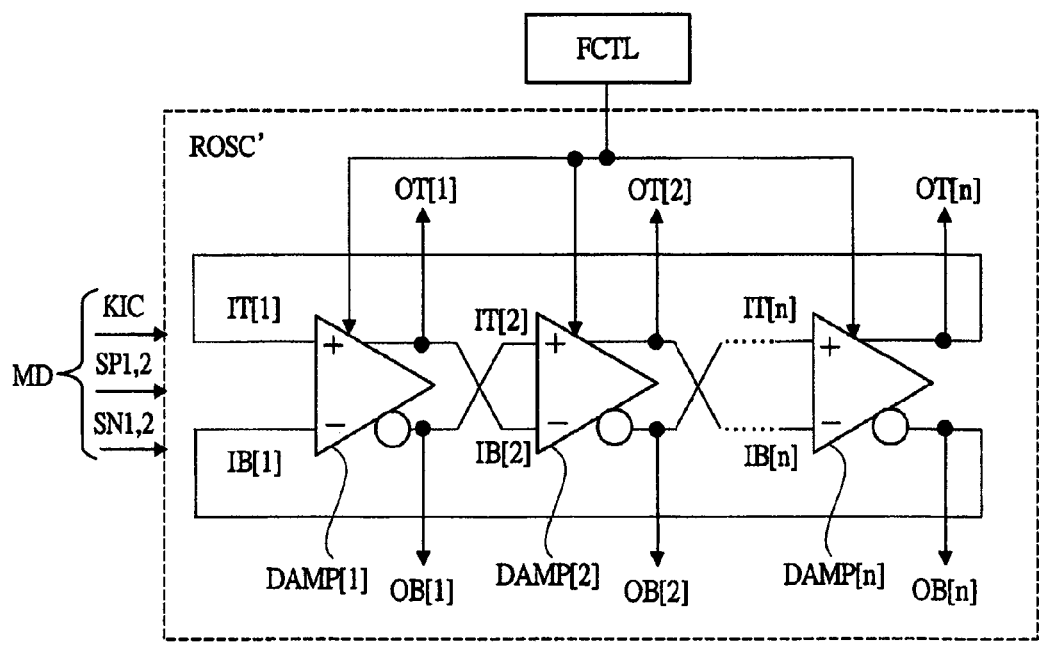
FIG. 18 is a circuit block diagram illustrating an exemplary modification of the ring oscillator circuit shown in FIG. 8B.

For example, a ring oscillator circuit ROSC' shown, for instance, in FIG. 18 may be used in place of the ring oscillator circuit ROSC shown in FIG. 8B. FIG. 18 is a circuit block diagram illustrating an exemplary modification of the ring oscillator circuit ROSC shown in FIG. 8B. As regards differential amplifier circuits DAMP[1] to DAMP[n−1] in the ROSC' shown in FIG. 18, the positive output node and negative output node (OT[1] and OB[1]) of one differential amplifier circuit (e.g., DAMP[1]) are respectively coupled to the negative input node and positive input node (IB[2] and IT[2]) of the next differential amplifier circuit (e.g., DAMP[2]). Meanwhile, the positive output node OT[n] and negative output node OB[n] of the last differential amplifier circuit DAMP[n] are respectively fed back to the positive input node IT[1] and negative input node IB[1] of the first differential amplifier circuit DAMP[1].

The semiconductor integrated circuit device according to an embodiment of the present invention incorporates a beneficial technology that is applicable to a PLL circuit used particularly in an optical disk system or the like. In addition, the technology incorporated in the semiconductor integrated circuit device is widely applicable not only to a PLL circuit used in an optical communication system or other high-speed communication system, but also to an oscillator circuit (ring oscillator circuit) used in various fields.

What is claimed is:

1. A semiconductor integrated circuit device comprising:
   a ring oscillator circuit that includes a plurality of cascaded differential amplifier circuits;
   wherein the differential amplifier circuits each include:
   a first transistor that operates in accordance with a potential difference between a first supply voltage node and a second supply voltage node, serves as one of a pair of differential input transistors, and is configured by coupling the gate thereof to a positive differential input node,
   a second transistor that serves as the remaining one of the pair of differential input transistors and is configured by coupling the gate thereof to a negative differential input node,
   a first limit transistor that uses a path between the first supply voltage node and the positive differential input node as a source-drain path,
   a second limit transistor that uses a path between the first supply voltage node and the negative differential input node as a source-drain path, a first gate control circuit that controls the gate of the first limit transistor, and a second gate control circuit that controls the gate of the second limit transistor; and wherein the first gate control circuit and the second gate control circuit have a first operation mode, in which the first gate control circuit causes the first limit transistor to function as a first diode for limiting the signal amplitude of the positive differential input node to a threshold voltage thereof, and the second gate control circuit causes the second limit transistor to function as a second diode for limiting the signal amplitude of the negative differential input node to a threshold voltage thereof.

2. The semiconductor integrated circuit device according to claim 1, wherein the first gate control circuit and the second gate control circuit additionally have a second operation mode, in which the first gate control circuit causes the first limit transistor to function as a first control switch and causes the first control switch to alternate between a conduction state and a nonconduction state, and the second gate control circuit causes the second limit transistor to function as a second control switch and causes the second control switch to remain in either the conduction state or the nonconduction state.

3. The semiconductor integrated circuit device according to claim 2, wherein the first gate control circuit and the second gate control circuit further have a third operation mode, in which the first gate control circuit causes the first control switch to remain in the nonconduction state, and the second gate control circuit causes the second control switch to remain in the nonconduction state.

4. The semiconductor integrated circuit device according to claim 1, wherein the first transistor, the second transistor, the first limit transistor, and the second limit transistor are of the same conductivity type.

5. The semiconductor integrated circuit device according to claim 1, wherein the first gate control circuit includes a first switch, which is coupled between the gate of the first limit transistor and the positive differential input node, a second switch, which is coupled between the gate of the first limit transistor and the second supply voltage node, and a third switch, which is coupled between the gate of the first limit transistor and the first supply voltage node; and wherein the second gate control circuit includes a fourth switch, which is coupled between the gate of the second limit transistor and the negative differential input node, and a fifth switch, which is coupled between the gate of the second limit transistor and the first supply voltage node.

6. The semiconductor integrated circuit device according to claim 5, wherein each of the differential amplifier circuits further includes a first current source, which is coupled between the second supply voltage node and the drain of the first transistor to output a current in accordance with an oscillation frequency setting for the ring oscillator circuit; a second current source, which is coupled between the second supply voltage node and the drain of the second transistor to output a current in accordance with the oscillation frequency setting; a first inverter circuit, which performs an inversion operation by using the drain of the first transistor as an input and the drain of the second transistor as an output; and a second inverter circuit, which performs an inversion operation by using the drain of the second transistor as an input and the drain of the first transistor as an output.

7. A semiconductor integrated circuit device comprising:
a ring oscillator circuit that includes a plurality of cascaded differential amplifier circuits;
wherein the differential amplifier circuits each include
a first transistor that operates in accordance with a potential difference between a first supply voltage node and a second supply voltage node, serves as one of a pair of differential input transistors, and is configured by coupling the gate thereof to a positive differential input node,
a second transistor that serves as the remaining one of the pair of differential input transistors and is configured by coupling the gate thereof to a negative differential input node,
a first limit transistor that uses a path between the first supply voltage node and the positive differential input node as a source-drain path,
a second limit transistor that uses a path between the first supply voltage node and the negative differential input node as a source-drain path,
a first gate control circuit that controls the gate of the first limit transistor, and
a second gate control circuit that controls the gate of the second limit transistor;
wherein the first gate control circuit includes a third transistor that uses a path between the gate of the first limit transistor and the positive differential input node as a source-drain path; and
wherein the second gate control circuit includes a fourth transistor that uses a path between the gate of the second limit transistor and the negative differential input node as a source-drain path.

8. The semiconductor integrated circuit device according to claim 7, wherein the first gate control circuit exercises control to place the third transistor in either the conduction state or the nonconduction state; and wherein the second gate control circuit exercises control to place the fourth transistor in either the conduction state or the nonconduction state.

9. The semiconductor integrated circuit device according to claim 7, further comprising:
a limit amount control circuit that outputs a limit amount setup voltage in accordance with an oscillation frequency setting for the ring oscillator circuit;
wherein the limit amount setup voltage is applied to the gates of the third and fourth transistors.

10. The semiconductor integrated circuit device according to claim 9, wherein the first gate control circuit further includes a first switch, which is coupled between the gate of the first limit transistor and the second supply voltage node, a second switch, which is coupled between the gate of the first limit transistor and the first supply voltage node, and a third switch, which drives the third transistor off when power-on control is exercised; and wherein the second gate control circuit includes a fourth switch, which drives the fourth transistor off when power-on control is exercised.

11. The semiconductor integrated circuit device according to claim 9, wherein each of the differential amplifier circuits further includes a first current source, which is coupled between the second supply voltage node and the drain of the first transistor to output a current in accordance with an oscillation frequency setting for the ring oscillator circuit; a second current source, which is coupled between the second supply voltage node and the drain of the second transistor to output a current in accordance with the oscillation frequency setting; a first inverter circuit, which performs an inversion operation by using the drain of the first transistor as an input and the drain of the second transistor as an output; and a second inverter circuit, which performs an inversion operation by using the drain of the second transistor as an input and the drain of the first transistor as an output.

12. A semiconductor integrated circuit device comprising:
a ring oscillator circuit that includes a plurality of cascaded differential amplifier circuits;
wherein the differential amplifier circuits each include
a first transistor that operates in accordance with a potential difference between a first supply voltage node and a second supply voltage node, serves as one of a pair of differential input transistors, and is configured by coupling the gate thereof to a positive differential input node,
a second transistor that serves as the remaining one of the pair of differential input transistors and is configured by coupling the gate thereof to a negative differential input node,
a first limit transistor that uses a path between the first supply voltage node and the positive differential input node as a source-drain path,
a second limit transistor that uses a path between the first supply voltage node and the negative differential input node as a source-drain path,
a first gate control circuit that controls the gate of the first limit transistor, and
a second gate control circuit that controls the gate of the second limit transistor;
wherein the first gate control circuit and the second gate control circuit have a first operation mode, in which the first gate control circuit causes the first limit transistor to function as a first variable resistor having a resistance value corresponding to a setting, and the second gate control circuit causes the second limit transistor to function as a second variable resistor having a resistance value corresponding to a setting.

13. The semiconductor integrated circuit device according to claim 12, wherein the first gate control circuit and the second gate control circuit additionally have a second operation mode, in which the first gate control circuit causes the first limit transistor to function as a first control switch and causes the first control switch to alternate between a conduction state and a nonconduction state, and the second gate control circuit causes the second limit transistor to function as a second control switch and causes the second control switch to remain in either the conduction state or the nonconduction state.

14. The semiconductor integrated circuit device according to claim 13, wherein the first gate control circuit and the second gate control circuit further have a third operation mode, in which the first gate control circuit causes the first control switch to remain in the nonconduction state, and the second gate control circuit causes the second control switch to remain in the nonconduction state.

15. The semiconductor integrated circuit device according to claim 12, wherein the first transistor, the second transistor, the first limit transistor, and the second limit transistor are of the same conductivity type.

16. The semiconductor integrated circuit device according to claim 12, further comprising:
a limit amount control circuit that outputs a limit amount setup voltage in accordance with an oscillation frequency setting for the ring oscillator circuit;
wherein the first gate control circuit includes a first switch, which is coupled between the gate of the first limit transistor and the output of the limit amount control circuit, a second switch, which is coupled between the gate of the first limit transistor and the second supply voltage node, and a third switch, which is coupled between the gate of the first limit transistor and the first supply voltage node; and wherein the second gate control circuit includes a fourth switch, which is coupled between the gate of the second limit transistor and the output of the limit amount control circuit.

17. The semiconductor integrated circuit device according to claim 16, wherein each of the differential amplifier circuits further includes a first current source, which is coupled between the second supply voltage node and the drain of the first transistor to output a current in accordance with an oscillation frequency setting for the ring oscillator circuit; a second current source, which is coupled between the second supply voltage node and the drain of the second transistor to output a current in accordance with the oscillation frequency setting; a first inverter circuit, which performs an inversion operation by using the drain of the first transistor as an input and the drain of the second transistor as an output; and a second inverter circuit, which performs an inversion operation by using the drain of the second transistor as an input and the drain of the first transistor as an output.

* * * * *